(12) United States Patent
Koyama et al.

(10) Patent No.: US 8,097,901 B2
(45) Date of Patent: Jan. 17, 2012

(54) SEMICONDUCTOR DEVICE HAVING INSULATED GATE SEMICONDUCTOR ELEMENT, AND INSULATED GATE BIPOLAR TRANSISTOR

(75) Inventors: Masaki Koyama, Nukata-gun (JP); Yoshifumi Okabe, Anjo (JP); Makoto Asai, Anjo (JP); Takeshi Fujii, Matsumoto (JP); Koh Yoshikawa, Matsumoto (JP)

(73) Assignees: Denso Corporation, Kariya (JP); Fuji Electric Device Technology Co., Ltd., Tokyo (JP)

( * ) Notice: Subject to any disclaimer, the term of this patent is extended or adjusted under 35 U.S.C. 154(b) by 0 days.

(21) Appl. No.: 13/115,137

(22) Filed: May 25, 2011

(65) Prior Publication Data

US 2011/0220962 A1  Sep. 15, 2011

Related U.S. Application Data

(62) Division of application No. 12/320,497, filed on Jan. 27, 2009, now Pat. No. 7,977,704.

(30) Foreign Application Priority Data

Jan. 28, 2008  (JP) ................................. 2008-015760
Oct. 21, 2008  (JP) ................................. 2008-271135
Nov. 7, 2008  (JP) ................................. 2008-287036

(51) Int. Cl.
*H01L 29/739* (2006.01)
(52) U.S. Cl. ................................. 257/139; 257/E29.197
(58) Field of Classification Search .................. 257/139, 257/E29.197
See application file for complete search history.

(56) References Cited

U.S. PATENT DOCUMENTS

| | | | |
|---|---|---|---|
| 5,329,142 A | 7/1994 | Kitagawa et al. | |
| 5,448,083 A | 9/1995 | Kitagawa et al. | |
| 5,585,651 A | 12/1996 | Kitagawa et al. | |
| 5,689,121 A | 11/1997 | Kitagawa et al. | |

(Continued)

FOREIGN PATENT DOCUMENTS

JP  2006-049455  2/2006

OTHER PUBLICATIONS

Office Action mailed on Feb. 26, 2010 issued from the German Patent Office in the corresponding German patent application No. 10 2009 005 914.8-33 (with English translation).

(Continued)

*Primary Examiner* — Zandra Smith
*Assistant Examiner* — Paul Patton
(74) *Attorney, Agent, or Firm* — Posz Law Group, PLC

(57) ABSTRACT

A semiconductor device having an IGBT includes: a substrate; a drift layer and a base layer on the substrate; trenches penetrating the base layer to divide the base layer into base parts; an emitter region in one base part; a gate element in the trenches; an emitter electrode; and a collector electrode. The one base part provides a channel layer, and another base part provides a float layer having no emitter region. The gate element includes a gate electrode next to the channel layer and a dummy gate electrode next to the float layer. The float layer includes a first float layer adjacent to the channel layer and a second float layer apart from the channel layer. The dummy gate electrode and the first float layer are coupled with a first float wiring on the base layer. The dummy gate electrode is isolated from the second float layer.

4 Claims, 34 Drawing Sheets

U.S. PATENT DOCUMENTS

| | | | |
|---|---|---|---|
| 5,838,026 | A | 11/1998 | Kitagawa et al. |
| 5,977,570 | A | 11/1999 | Takahashi et al. |
| 6,153,896 | A | 11/2000 | Omura et al. |
| 6,265,735 | B1 | 7/2001 | Takahashi et al. |
| 6,380,586 | B1 | 4/2002 | Yoshikawa |
| 6,399,998 | B1 * | 6/2002 | Chang .......................... 257/565 |
| 6,445,012 | B2 | 9/2002 | Takahashi et al. |
| 6,534,998 | B1 | 3/2003 | Omura et al. |
| 6,693,310 | B1 | 2/2004 | Takahashi et al. |
| 6,737,705 | B2 | 5/2004 | Momota et al. |
| 6,867,437 | B2 | 3/2005 | Takahashi et al. |
| 6,897,493 | B2 | 5/2005 | Takahashi et al. |
| 7,253,031 | B2 | 8/2007 | Takahashi et al. |

OTHER PUBLICATIONS

Chinese Office Action dated on May 4, 2010 issued from the Chinese Patent Office in the corresponding Chinese patent application No. 200910009837.1 (with English translation).

* cited by examiner

|  |  | XXIVA | XXIVB | XXIVC | XXIVD | XXIVE |
|---|---|---|---|---|---|---|
| $V_{CE}$max. | [V] | 1232 | 1222 | 1080 | 1091 | 1264 |
| $\Delta V_{CE}$ | [V] | 200 | 196 | >570 | >223 | 225 |

US 8,097,901 B2

SEMICONDUCTOR DEVICE HAVING INSULATED GATE SEMICONDUCTOR ELEMENT, AND INSULATED GATE BIPOLAR TRANSISTOR

CROSS REFERENCE TO RELATED APPLICATIONS

This application is a divisional of U.S. application Ser. No. 12/320,497 filed on Jan. 27, 2009 which is based on and claims priority to Japanese Patent Applications No. 2008-015760 filed on Jan. 28, 2008, No. 2008-271135 filed on Oct. 21, 2008, and No. 2008-287036 filed on Nov. 7, 2008, the disclosure of which are incorporated herein by reference.

FIELD OF THE INVENTION

The present invention relates to a semiconductor device having an insulated gate semiconductor element, and an insulated gate bipolar transistor.

BACKGROUND OF THE INVENTION

An insulated gate semiconductor device such as a trench gate type transistor and an IGBT functions as a high break down voltage insulated gate semiconductor device having a trench gate structure. FIGS. 17 and 18 show IGBTs disclosed in JP-A-2006-49455. Each IGBT includes an N+ type emitter region 101 for contacting an emitter electrode is selectively formed in a P type base region 102. A dummy trench 103 is formed in a region other than the emitter region 101. Thus, multiple trenches are homogeneously formed. Specifically, the emitter region 101 is not formed in a whole base region 102, but formed in a part of the base region 102. The trench 105 is formed in the part of the base region 102. A gate electrode 104 is formed in the trench 105 so that a gate voltage is applied to the gate electrode 104. No emitter region 102 is formed in another part of the base region 102. However, a dummy trench 103 is formed in the other part of the base region 102. A dummy gate electrode 106 is formed in the dummy trench 103.

Thus, the emitter region 101 is selectively formed in the base region 102, so that conductivity modulation in the base region 102 is promoted. Here, the base region 102 has high resistance. Accordingly, energization loss is much reduced. Since the dummy trench 103 is formed, a break down voltage is improved. Both of the energization loss and the break down voltage are improved. In the IGBT, to stabilize an electric potential of the dummy gate electrode 106, the dummy gate electrode 106 is connected to the emitter electrode E, as shown in FIG. 17. Alternatively, the dummy gate electrode 106 may be connected to the gate electrode 104, as shown in FIG. 18.

However, when the dummy gate electrode 106 in the dummy trench 103 is connected to the emitter electrode E or the gate electrode 104, the following difficulties arise.

When the dummy gate electrode 106 is connected to the gate electrode 104, a capacitance between the gate G and the collector C increases, so that a switching loss becomes large. Further, when the dummy gate electrode 106 is connected to the emitter electrode E, a capacitance between the gate G and the emitter E increases, so that a switching surge voltage becomes large.

Further, a trench gate IGBT among a power semiconductor device operates with a MOS gate driving method, so that controllability of the device is very high. Further, a bipolar operation is performed in the IGBT, and thereby, a saturated voltage is comparatively low. Accordingly, the IGBT is used for many applications. Since the power device is used as a non-contact switch, it is preferred to have a small generation loss. It is required for the IGBT to have small saturated voltage and a low switching loss. A relationship between the saturated voltage of the IGBT and a switching loss, i.e., a turn-off loss of the IGBT is trade-off. In general, the relationship of the trade off represents a trade off characteristics, which shows an index of generated loss in the power device. Thus, it is required to improve the trade off characteristics. Further, it is also required for the device to reduce an electro magnetic noise. To reduce the electro magnetic noise, it is necessary to reduce a voltage drop speed (i.e., dV/dt) and a current increase acceleration (i.e., dIc/dt) in case of turning off. However, when the dV/dt and dIc/dt are reduced, the switching loss increases. Thus, it is difficult to reduce both of the electro magnetic noise and the switching loss. In general, the turn-on loss and the electro magnetic noise have a trade off relationship. Here, to reduce the electro magnetic noise, it is important to change a hard switching to a soft switching when the device turns on without increasing the turn-on loss. This is, the waveform of dIc/dt is changed from large to small.

Regarding the electro magnetic noise when the IGBT turns on, it is known that a device characteristic much affects the electro magnetic noise in a case where the IGBT turns on with a small current equal to one-tenth of a current rating. Specifically, the reason why the electro magnetic noise having a frequency in a range equal to or larger than 30 MHz is generated may relate to high voltage drop speed having a high frequency component. Accordingly, to maintain the dVdt in case of switching within a threshold at which the electro magnetic noise is not generated, a gate resistance is controlled so that a main current increase rate (i.e., dIc/dt) in case of turning on is limited.

When only the gate resistance increases, the turn-on loss of the IGBT increases when the IGBT turns on. Thus, when the gate resistance increases, the current increase rate in case of turning on is reduced, and a voltage tail also increases. Thus, the switching loss increases. Accordingly, in the characteristics of the trench type IGBT, it is preferable that the gate resistance is comparatively small, and the dIc/dt is sufficiently small.

The trench type IGBT is shown in FIG. 31. The N channel type IGBT includes a trench gate structure having a stripe pattern on a surface of the silicon substrate. FIG. 31 is a cross sectional view showing the IGBT along with a direction in parallel to the stripe pattern and perpendicular to the silicon substrate. In FIG. 31, the IGBT includes an N type base layer 201 having a small impurity concentration, a P type collector layer 202 having a high impurity concentration and disposed on a principal surface of the base layer 201, and a P type channel region 203a disposed on another principal surface of the base layer 201. A N+ type emitter region 204 is selectively formed in a surface portion of the channel region 3a. A trench 205a is formed from a surface on an emitter region side and penetrates the channel region 203a and reaches the base layer 201. A gate electrode 207a is formed in the trench 205 through an insulation film 206. The gate electrode 207a is made of conductive poly silicon. A method for forming the device is such that the trench 205a is formed on the surface of the channel region 203a, the gate insulation film is formed in the trench 205a, and the gate electrode 207a is filled in the trench 205a, and then, the emitter region 204 is formed. Further, an interlayer insulation film 20 is formed to cover the gate electrode 207a. Furthermore, the emitter electrode 210 made of a metallic film is formed over the interlayer insulation film 208. The emitter electrode 210 contacts the surface of the emitter region 204 and the surface of the channel region 203a. In general, the trench type IGBT includes a P type body region 209 having a high impurity concentration and disposed on a part of the surface of the channel region 203a so that a latch-up immunity is improved. A N type buffer region or a field stop region 211 having a middle impurity concentration is formed between the base layer 201 and the collector layer 202. The buffer region or the field stop region 211 is made of Se. Further, a protection film may be formed over the silicon substrate. The protection film is made of a silicon nitride film, an amorphous silicon film or a poly imide film. A collector electrode 220 made of a metallic film is formed on the surface of the collector layer 202.

The operation of the IGBT for turning on will be explained. When the IGBT turns off, the emitter electrode 210 is grounded, and a voltage is applied to the collector electrode 220, so that the IGBT shows a blocking state when a voltage is smaller than an inverse breakdown voltage since the base layer 201 and the channel region 203a provides an inverse bias PN junction. In this case, when a voltage higher than a threshold voltage is applied to the gate electrode 207a, a charge is accumulated in the gate electrode 207a from a gate driving circuit through the gate resistance. At the same time, an N type channel switched from a P type to an N type is formed in a surface portion of the channel region 203a along with a trench sidewall. The N type channel is arranged between the emitter region 204 and the base layer 201, the emitter region 204 is exposed on the sidewall of the trench 205a. The channel region 203a contacts the gate electrode 207a through the gate insulation film 206. When the N type channel is formed, the inverse bias junction is disappeared in the N type channel, so that the electrons are injected in the base layer 201 through the emitter electrode 210, the emitter region 204 and the N type channel in the channel region 203a. When the electrons are injected in the base layer 201, a forward voltage is applied to the PN junction between the collector layer 202 and the base layer 201, so that holes as a minor carrier is injected in the base layer 201 from the collector layer 202. When the holes are injected in the base layer 201, the electron concentration of the electrons as a major carrier increases to maintain neutrality of the carriers in the base layer 201, and thereby, the resistance of the base layer 201 is reduced. Here, this phenomenon is called a conductivity modulation. In this case, if the voltage drop caused by the current flowing between the collector electrode 220 and the emitter electrode 210 is substantially equal to the on state voltage of the diode formed between the collector layer 202 and the emitter region 204, the on-state voltage of the IGBT shows an ideal voltage.

Next, to switch the IGBT from an on-state to an off-state, a voltage between the emitter electrode 210 and the gate electrode 207a is reduced to be smaller than the threshold. At this time, the charge accumulated in the gate electrode 207a is discharged to the gate driving circuit through the gate resistor, and the channel inverted to the N type is switched to the P type so that no channel exists in the IGBT. Thus, the electron supply is stopped, and the hole injection from the collector layer 202 is also stopped. However, the current continues to flow until the electrons in the base layer 201 is completely transmitted to the collector electrode 220, and the holes in the base layer 201 completely is transmitted to the emitter electrode 210, or until the electrons and the holes are completely re-combined so that they are disappeared. After the accumulated electrons and the accumulated holes are disappeared, the current stops flowing.

In the trench type IGBT, to reduce the on-state resistance, various methods are performed. For example, an IEGT (i.e., injection enhanced gate bipolar transistor) has characteristics, which are most excellent and close to a maximum limit of the on-state voltage of the diode. In the IEGT, as shown in FIG. 12, a part of the principal surface of the emitter region 204 and a part of the principal surface of the channel region 203a in the cell are covered with the interlayer insulation layer 208, so that these regions 203a, 208 do not contact the emitter electrode. The operation of the IEGT is similar to the trench type IGBT. The part of the emitter region 204 and the part of the channel region 203a not contacting the emitter electrode 210, and the holes in a portion under the P type channel region 203a are not discharged to the emitter electrode 210, so that the holes are accumulated in the portion. Thus, the carrier concentration distribution of the base layer 201 becomes closer to the carrier concentration distribution of the diode. Thus, the on-state voltage of the IEGT is smaller than that of the IGBT (which is disclosed in JP-A-H05-243561). Further, to improve both of the on-state voltage and the switching characteristics, a trench type IGBT is disclosed in JP-A-2000-228519, in which the accumulated carrier concentration on the emitter electrode side is increased.

It is required for the power device to have a low on-state voltage and high-speed switching characteristics. It is also required to improve the on-state voltage and the switching characteristics. However, the trench structure is formed to have high density in the trench type IGBT and the IEGT so that they have a low on-state voltage. Accordingly, the capacity between the gate electrode and the emitter electrode increases, so that the switching characteristics are reduced. Accordingly, the switching loss increases. In this case, the low on-state voltage and the low switching loss or the high-speed switching characteristics are related to trade off relationship. Thus, it is difficult to improve both of the on-state voltage and the switching characteristics.

Further, in general, the waveform of the device having the high-speed switching characteristics is hard when the device switches so that the device has a hard switching characteristics. An electro magnetic noise is easily generated in the device. Thus, it is difficult to form the power device such as IGBT having soft switching characteristics so that the device shows a soft waveform to reduce the electro magnetic noise and to have high-speed switching characteristics.

As described above, when the IGBT switches from the on-state to the off-state, it is necessary to charge and discharge the capacitance between the gate electrode and the emitter electrode. When the capacitance is large, the charge and discharge time increases so that the loss increases. Further, it is necessary to have a large gate driving circuit. The loss in the power device is a sum of a stationary loss defined by the on-state voltage and a switching loss in case of turning on and off. It is important to reduce the on-state voltage and to reduce the switching loss, i.e., to reduce the capacitance between the gate electrode and the emitter electrode. A semiconductor device having a low on-state voltage and a low capacitance between the gate electrode and the emitter electrode is shown in FIG. 29. The device has a P type channel region with a P type region without an $N^+$ type emitter region. Further, the P type region is not connected to the emitter electrode, so that the P type region is isolated. The P type region is in a floating state. The device is a trench type IEGT, which is disclosed in JP-A-2001-308327. Further, a trench type semiconductor device for a power source is disclosed in JP-A-H09-139510. This device has a low on-state voltage and a low stationary loss. Furthermore, FIG. 33 shows a trench type semiconductor device having a low on-state voltage, a low capacitance between a gate electrode and an emitter electrode and a high break down voltage. This device is disclosed in JP-A-2003-188382 and JP-A-2006-49455. FIGS. 30 and 34 also show trench type semiconductor device as a comparison having a low on-state voltage, a low capacitance between a gate electrode and an emitter electrode and a high break down voltage, according to a related art.

However, in the trench type IGBT shown in FIGS. 29-34 and the trench type IGBT and the IEGT disclosed in the above references, the break down voltage may be low. Alternatively, since these devices have the hard switching characteristics, electro magnetic noise is easily generated in the devices. The reason why it is difficult to increase break down voltage in the IGBT and the IEGT is such that an electric field distribution in a silicon substrate is inhomogeneous when the device turns off (i.e., when a voltage is not applied to the device). Thus, the electric field is concentrated at a bottom of the trench gate, so that the device may be broken down at a voltage lower than a specification break down voltage. The reason why the devices have the hard switching characteristics is such that a ratio between the capacitance between the gate and the collector and the capacitance between the gate and the emitter is small.

Thus, it is required to reduce the on-state voltage to be equal to that of the IEGT and to reduce the switching loss and to have the high break down voltage. Further, it is required to have soft switching characteristics.

SUMMARY OF THE INVENTION

In view of the above-described problem, it is an object of the present disclosure to provide a semiconductor device having an insulated gate semiconductor element. It is another object of the present disclosure to provide an insulated gate bipolar transistor.

According to a first aspect of the present disclosure, a semiconductor device having an insulated gate semiconductor element includes: a semiconductor substrate having a first conductive type; a drift layer having a second conductive type and disposed on the substrate; a base layer having the first conductive type and disposed on the drift layer; a plurality of trenches penetrating the base layer and reaching the drift layer, wherein the base layer is divided into a plurality of base parts by the plurality of trenches, and each trench extends along with a first direction; an emitter region having the second conductive type, disposed in one of the base parts, and contacting a sidewall of a corresponding trench; a gate element disposed in each trench via an insulation film; an emitter electrode electrically coupled with the emitter region; and a collector electrode disposed on a backside of the substrate, wherein the collector electrode is opposite to the drift layer. Each base part extends in the first direction so that the plurality of the base parts are in parallel to each other. The one of the base parts provides a channel layer, in which the emitter region is disposed, and another one of the base parts provides a float layer, in which no emitter region is disposed. The channel layer and the float layer are repeatedly arranged in a predetermined order in such a manner that a ratio between the number of the channel layer and the number of the float layer is constant. The gate element includes a gate electrode and a dummy gate electrode. The gate electrode is disposed in the corresponding trench contacting the channel layer, and the dummy gate electrode is disposed in another trench contacting the float layer. The float layer includes a first float layer adjacent to the channel layer via the gate electrode and a second float layer apart from the channel layer via the dummy gate electrode. The dummy gate electrode and the first float layer are electrically coupled with a first float wiring, which extends in a second direction perpendicular to the first direction and is disposed on the base layer. The dummy gate electrode is electrically isolated from the second float layer.

Since the dummy gate electrode is electrically connected to the first float layer, a switching surge voltage and a switching loss are balanced. Further, since the float layers are connected to different wirings, operation of the device is performed homogeneously, and thereby, a break down voltage of the device is improved.

According to a second aspect of the present disclosure, a semiconductor device having an insulated gate semiconductor element includes: a semiconductor substrate having a first conductive type; a drift layer having a second conductive type and disposed on the substrate; a base layer having the first conductive type and disposed on the drift layer; a plurality of trenches penetrating the base layer and reaching the drift layer, wherein the base layer is divided into a plurality of base parts by the plurality of trenches, and each trench extends along with a first direction; an emitter region having the second conductive type, disposed in one of the base parts, and contacting a sidewall of a corresponding trench; a gate element disposed in each trench via an insulation film; an emitter electrode electrically coupled with the emitter region; and a collector electrode disposed on a backside of the substrate, wherein the collector electrode is opposite to the drift layer. Each base part extends in the first direction so that the plurality of the base parts are in parallel to each other. The one of the base parts provides a channel layer, in which the emitter region is disposed, and another one of the base parts provides a float layer, in which no emitter region is disposed. The channel layer and the float layer are repeatedly arranged in a predetermined order in such a manner that a ratio between the number of the channel layer and the number of the float layer is constant. The gate element includes a gate electrode and a dummy gate electrode. The gate electrode is disposed in the corresponding trench contacting the channel layer, and the dummy gate electrode is disposed in another trench contacting the float layer. The float layer includes a first float layer adjacent to the channel layer via the gate electrode. The dummy gate electrode includes a first dummy gate electrode adjacent to the first float layer via the insulation film. The first dummy gate electrode and the first float layer are electrically coupled with a first float wiring, which extends in a second direction perpendicular to the first direction and is disposed on the base layer.

In the above device, a switching surge voltage and a switching loss are balanced. Further, operation of the device is performed homogeneously, and thereby, a break down voltage of the device is improved.

According to a third aspect of the present disclosure, a trench gate type insulated gate bipolar transistor includes: a semiconductor substrate having a first conductive type; a channel region having a second conductive type and disposed on a first side of the substrate, wherein the channel region includes a first channel region and a second channel region; an emitter region having the first conductive type and disposed in a surface portion of the first channel region; a plurality of trenches penetrating the channel region and reaching the substrate, wherein the plurality of trenches includes a first trench and a second trench, wherein the first channel region only contacts the first trench, and the second channel region contacts the second trench; a gate electrode disposed in the first trench via an insulation film; an embedded electrode disposed in the second trench via the insulation film, wherein the embedded electrode is electrically separated from the gate electrode; and an emitter electrode electrically coupling both the emitter region and the first channel region, wherein the emitter electrode covers the gate electrode, the embedded electrode and the second channel region via the insulation film so that the emitter electrode is electrically separated from the gate electrode, the embedded electrode and the second channel region. The embedded electrode electrically couples at least the second channel region, which is sandwiched between the first trench and the second trench.

In the above transistor, the on-state voltage is low, which is almost equal to that of an IEGT. Further, the transistor has a low switching loss, a high breakdown voltage and soft switching characteristics.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 19:
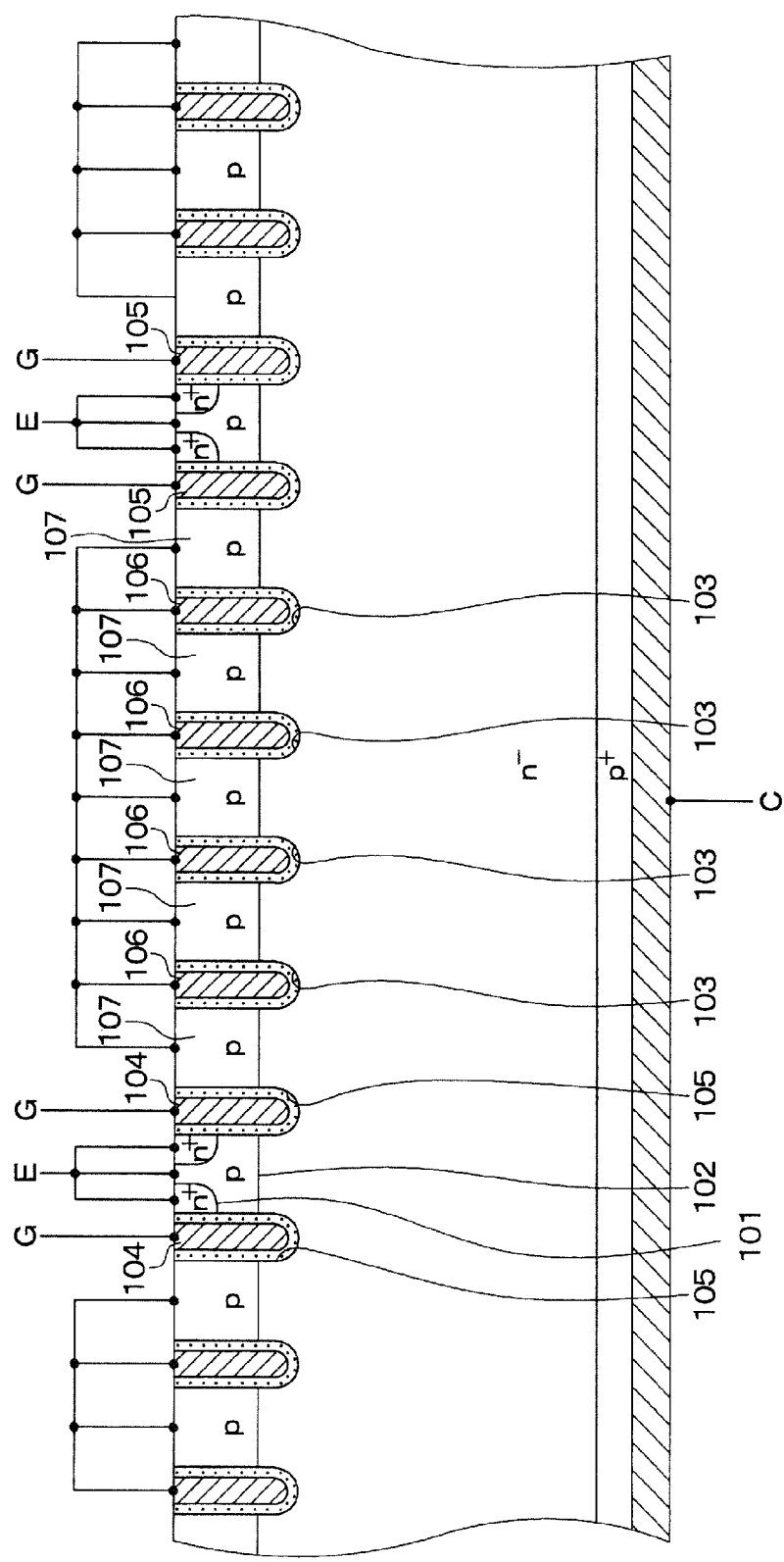
FIG. 19 is a cross sectional view showing a semiconductor device having a dummy gate electrode connecting to a float layer according to a related art.

In some devices, it is required to have a medium switching surge voltage and a medium switching loss. To realize this requirement, the inventors have preliminarily studied about a device, in which a dummy gate electrode 106 in a dummy trench 103 may be connected to a float layer 107, as shown in FIG. 19. FIG. 19 shows the device as a comparison according to a related art.

However, when the dummy gate electrode 106 is connected to the float layer 107, an electric potential of the float layer 107 becomes imbalance, so that current may concentrate at a connection portion therebetween and another part apart from the connection portion. Thus, a break down voltage of the device is reduced. For example, when multiple dummy trenches 103 are arranged in a stripe manner, the float layer 107 is arranged between adjacent two dummy trenches 103. Thus, one wiring line disposed on the dummy trench 103 and the float layer 107 electrically connects the dummy gate electrode 106 and the float layer 107. In this case, it is necessary to increase the area of the emitter electrode connecting to the emitter region 101. Accordingly, the wiring line connecting the dummy gate electrode 106 and the float layer 107 becomes thin. A part of the float layer 107 near the connection portion between the float layer 107 and the wiring line has the same electric potential as the wiring line. However, another part of the float layer 107 apart from the connection portion between the float layer 107 and the wiring line has a different electric potential. For example, as a distance from the wiring line in an extending direction of the float layer 107, i.e., a perpendicular direction of the drawing of FIG. 19, becomes large, the electric potential difference in the float layer 107 becomes large. Thus, since the electric potential difference of the float layer 107 in the extending direction of the float layer 107 becomes large, operational imbalance arises in case of switching. Thus, the current concentrates at a certain portion, so that the break down voltage of the device is reduced.

Thus, it is required to reduce an electric potential difference between two float layers so that a breakdown voltage reduction caused by current concentration is improved.

First Embodiment

Figure 1:
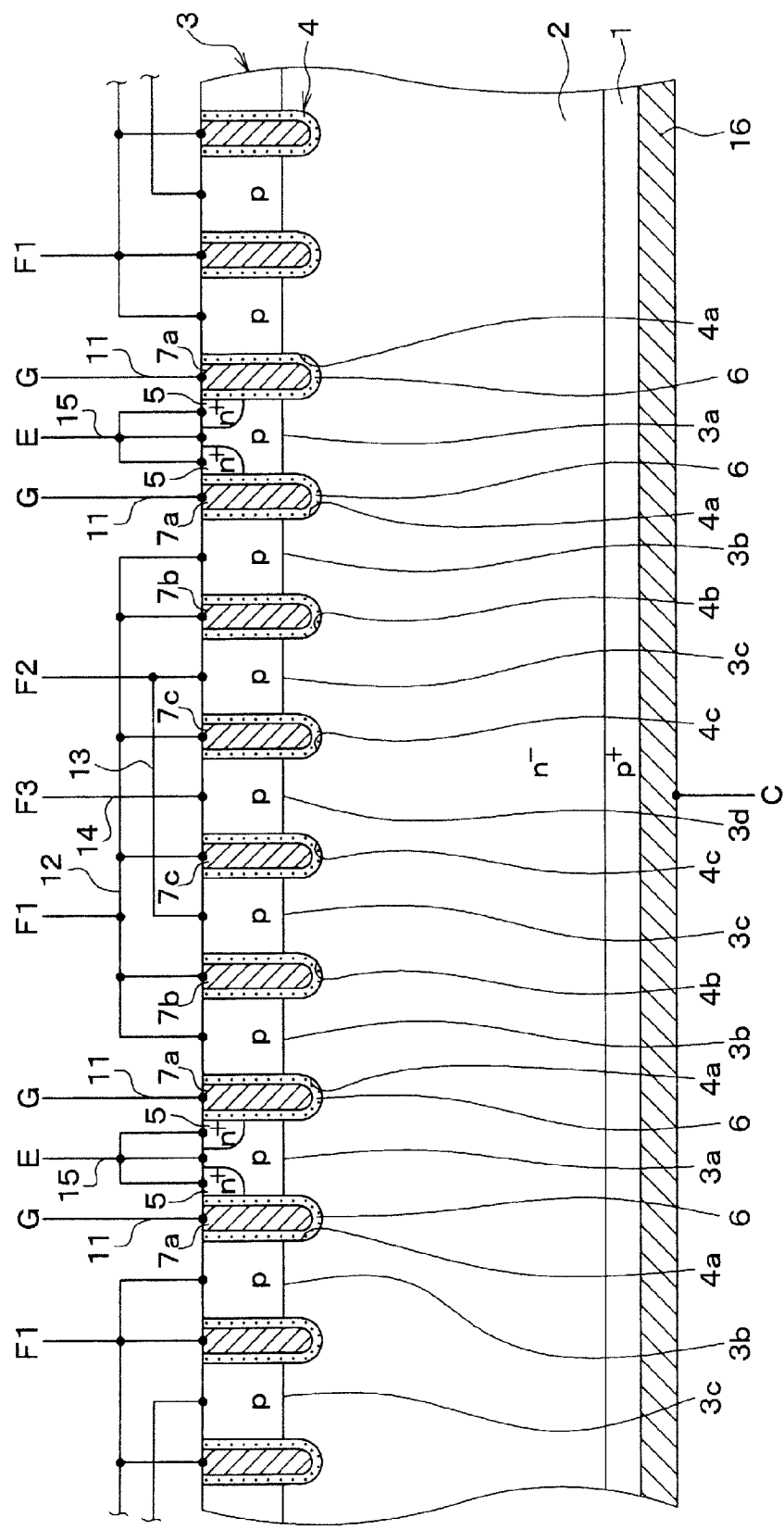
FIG. 1 is a cross sectional view showing a semiconductor device according to a first embodiment.
Figure 2:
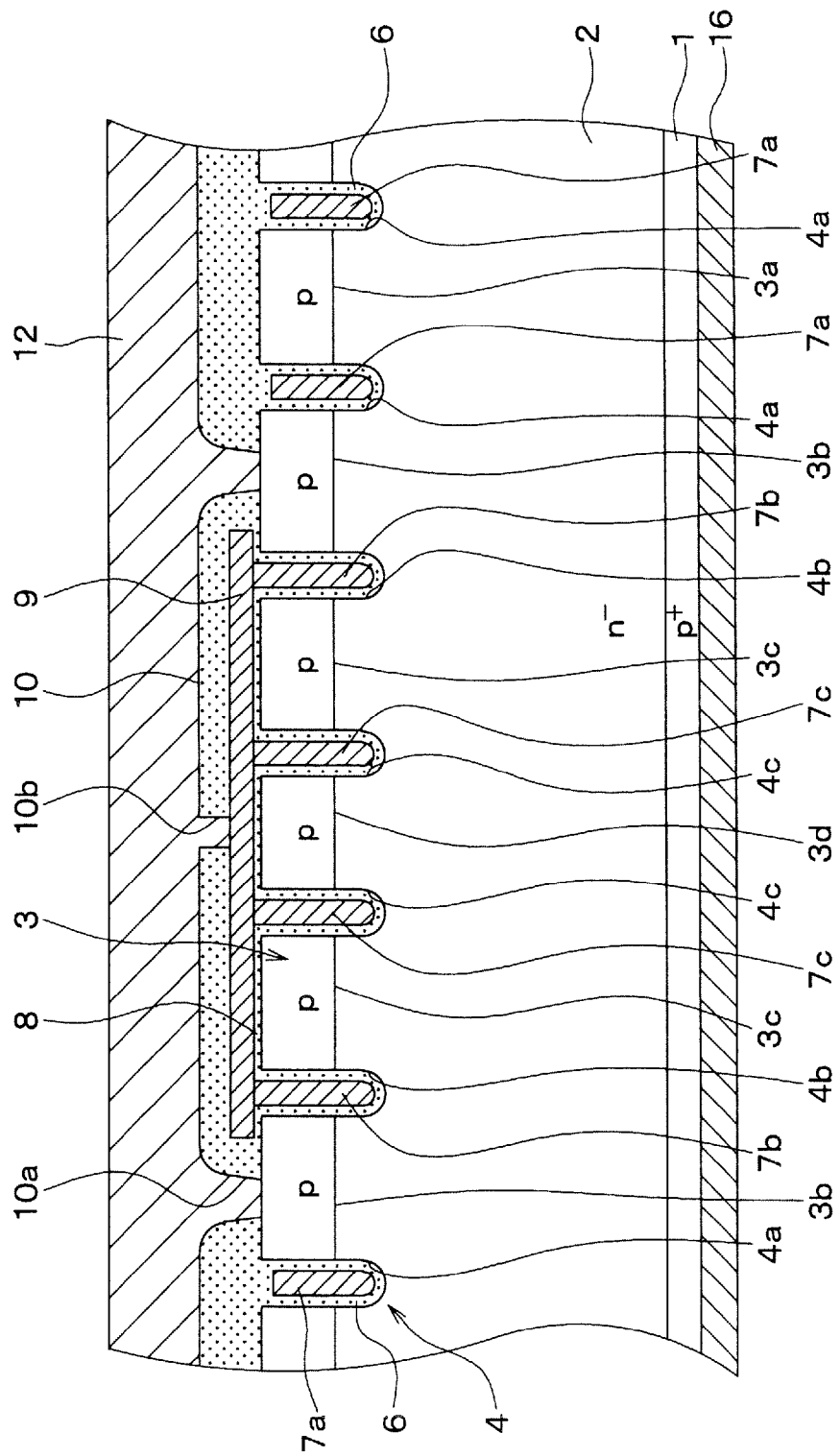
FIG. 2 is another cross sectional view showing the semiconductor device in FIG. 1.
Figure 3:
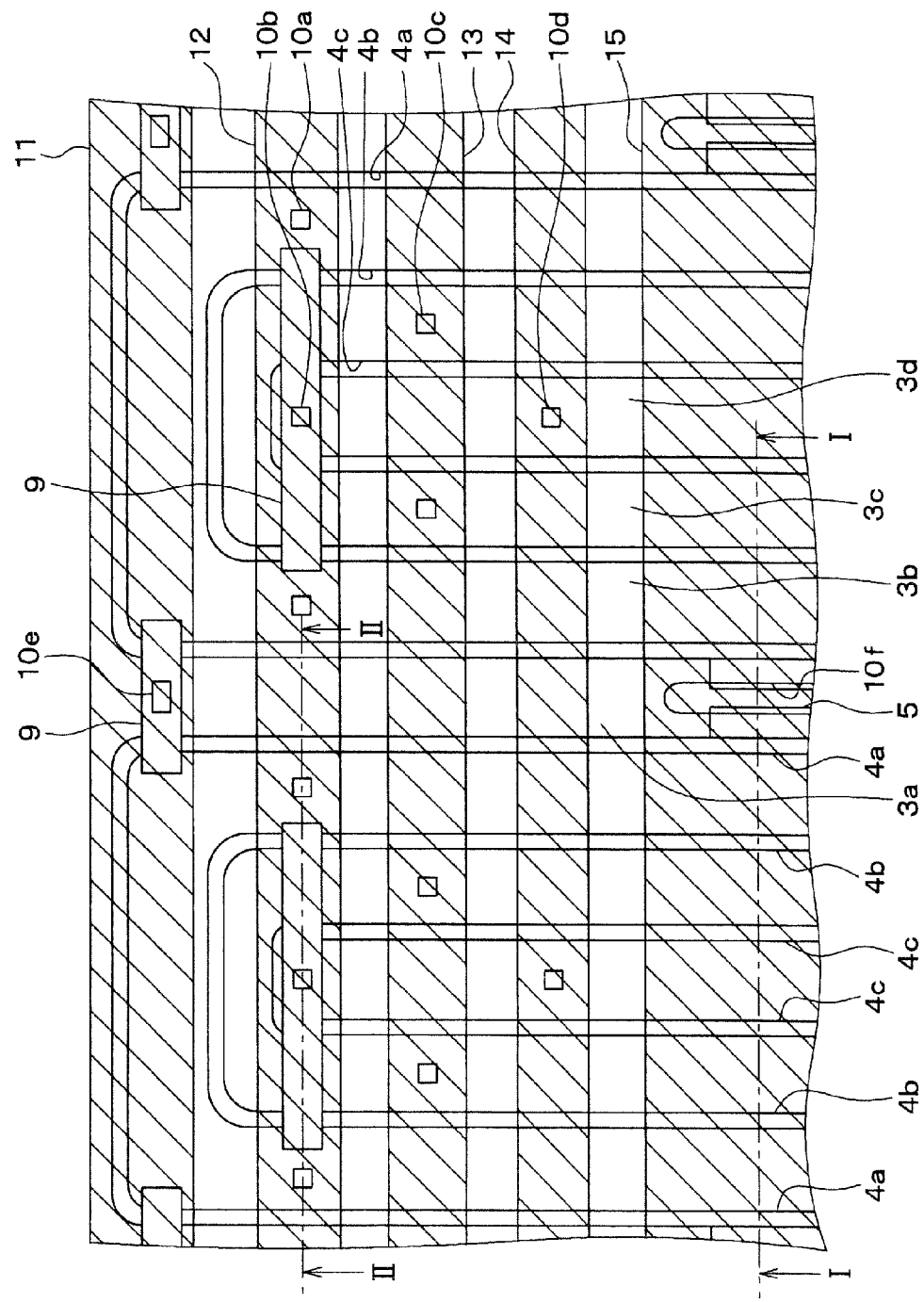
FIG. 3 is an upper plan view showing the semiconductor device in FIG. 1.

FIG. 1 shows a semiconductor device having an IGBT taken along line I-I in FIG. 3. FIG. 2 shows the device taken along line in FIG. 3. Although FIG. 3 is not a cross sectional view, there is a hatching area in FIG. 3 to understand a structure easily.

An IGBT is formed in a $P^+$ type substrate 1 having a principal surface. The substrate 1 has a high impurity concentration. A N− type drift layer 2 is formed on the principal surface of the substrate 1 by an epitaxial growth method. The drift layer 2 has a low impurity concentration, which is lower than the substrate 1.

Figure 4:
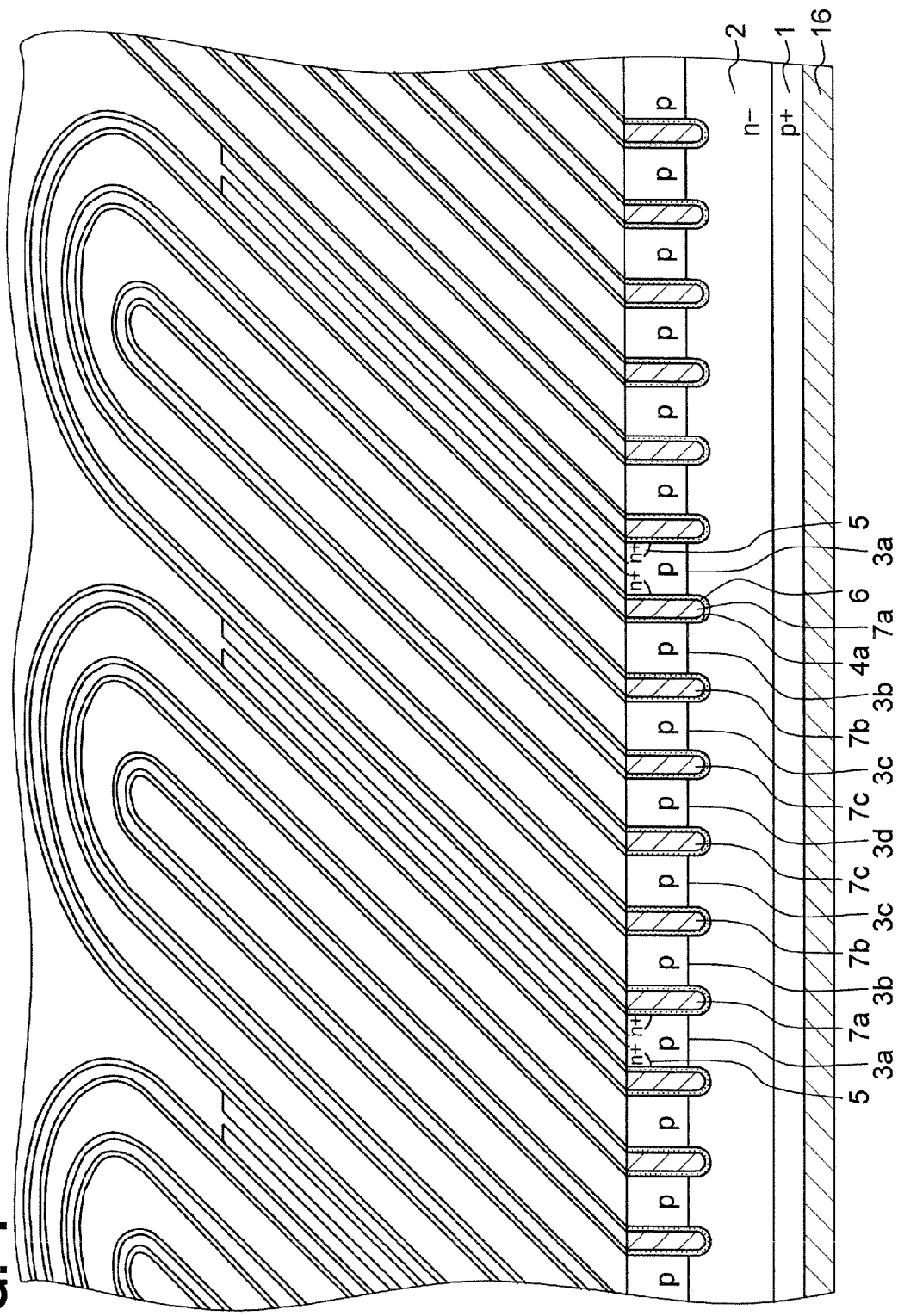
FIG. 4 is a partial perspective view showing the semiconductor device in FIG. 1.

A P type base region 3 having a predetermined thickness is formed in a surface portion of the drift layer 2. Multiple trenches 4 are formed on the substrate 1 such that each trench 4 penetrates the base region 3 and reaches the drift layer 2. The base region 3 is divided into multiple base portions by the trenches 4. Specifically, the trenches are arranged at predetermined intervals. Each trench 4 extends along with a direction perpendicular to the drawing of FIGS. 1 and 2. The trenches 4 extend in parallel to each other. As shown in FIG. 4, one end of the trench 4 is curved so that corresponding two trenches are connected to each other. Thus, two trenches provide a ring structure. In FIG. 4, three rings provide one unit so that triple ring structure is formed. Alternatively, two rings or more than three rings may provide one unit. Adjacent two trenches 4 extend in parallel to each other along with a longitudinal direction of the trenches 4. The trenches 4 includes an utmost outer trench 4a, a first inner trench 4b, and a second inner trench 4c. The utmost outer trench 4a is disposed on an utmost outer side in the unit, the first inner trench 4b is disposed on an inner side of the utmost outer trench 4a by one trench, and the second inner trench 4c is disposed on an inner side of the first inner trench 4b by one trench. Here, in FIG. 4, the second inner trench 4c provides an utmost inner trench 4c, which is disposed on an utmost inner side in the unit. Thus, the utmost outer trench 4a, and the first and second inner trenches 4b, 4c form a multiple ring structure.

The base region 3 is arranged between two adjacent utmost outer trenches 4a. The base region 3 provides a P type channel layer 3a for forming a channel region. A $N^+$ type emitter region 5 is formed in a surface portion of the channel layer 3a.

The emitter region 5 has a high impurity concentration higher than the drift layer 2. The emitter region 5 has a bottom in the base region 3 so that the emitter region 5 is fully arranged in the base region 3. Further, the emitter region 5 contacts a sidewall of the utmost outer trench 4a. Specifically, the emitter region 5 extends along with the longitudinal direction of the utmost outer trench 4a. The emitter region 5 has a bar shape. The emitter region 5 has an end, which does not reach a curved portion of the utmost outer trench 4a so that the emitter region 5 is terminated on an inner side of the curved end of the utmost outer trench 4a. Accordingly, the utmost outer trench 4a disposed on both sides of the emitter region 5 provides the gate electrode forming trench. The first and second inner trenches 4b, 4c provide the dummy trenches.

Specifically, a gate insulation film 6 is formed on an inner wall of the trench 4. A gate electrode 7a-7c is formed in the trench 4 via the gate insulation film 6. The gate electrode 7a-7c is made of doped poly silicon or the like. As shown in FIGS. 1-3, the gate electrode 7a disposed in the utmost outer trench 4a is connected to a gate wiring 11 electrically. A gate voltage is applied to the gate electrode 7a via the gate wiring 11. The dummy gate electrodes 7b, 7c in the first and second inner trenches 4b, 4c are connected to a first float wiring 12. The first float wiring 12 is connected to a first float layer 3b. The first float layer 3b is provided by the base region 3, which is sandwiched between the utmost outer trench 4a and the first inner trench 4b. A second float layer 3c is provided by the base region 3, which is sandwiched between the first inner trench 4b and the second inner trench 4c. The second float layer 3c is connected to the second float wiring 13. Further, the base region 3 disposed on an inside of the second inner trench 4c provides a third float layer 3d. The third float layer 3d is connected to a third float wiring 14.

The first to third float wirings 12-14, the dummy gate electrodes 7b, 7c and the first and second float layers 3b, 3c may be electrically coupled with each other in any manner as long as the wirings, the electrodes and the layers are not short-circuited. In this embodiment, the electric connection with the second float wiring 13 is performed by a structure shown in FIG. 2.

In FIG. 2, the insulation layer 8 covers the surface of the float layers 3b-3d. A doped poly silicon layer 9 for providing the dummy gate electrodes 7b, 7c extends to reach the second and third float layers 3c, 3d so that the doped poly silicon layer 9 is arranged on the second and third float layers 3c, 3d. Thus, the dummy gate electrodes 7b, 7c are electrically connected to each other via the doped silicon layer 9. An interlayer insulation film 10 insulates each part of the device. Contact holes 10a, 10b are formed in the interlayer insulation film 10. A part of the doped poly silicon layer 9 and a part of the first float layer 3b are exposed through the through holes 10a, 10b. The first float wiring 12 is arranged on the part of the doped poly silicon layer 9 and the part of the first float layer 3b. Thus, the dummy gate electrodes 7b, 7c, the first float layer 3b and the first float wiring 12 are electrically connected to each other.

The dummy gate electrodes 7b, 7c is electrically connected to the first float layer 3b via the first float wiring 12. The second float layer 3c is electrically connected to the second float wiring 13, and the third float layer 3d is electrically connected to the third float wiring 14. Alternatively, the device may not have the second float wiring 13 and the third float wiring 14. In this case, the second float layer 3c and the third float layer 3d are in a floating state.

The first to third float wirings 12-14, the emitter electrode 15 connecting to the emitter region 5, and the gate wiring 11 connecting to the gate electrode 7a are arranged to be perpendicular to the longitudinal direction of the trench 4. Specifically, the emitter electrode 15 is arranged to cover an inner side of a cell with a wide area. The third float wiring 14, the second float wiring 13, the first float wiring 12 and the gate wiring 11 are in parallel to each other, and arranged in this order on the curved portion of the trench 4 i.e., the end portion of the trench 4. The third float wiring 14, the second float wiring 13, the first float wiring 12 and the gate wiring 11 have a linear shape.

The first float wiring 12 is electrically connected to the doped poly silicon layer 9 formed on the insulation film 8 via the contact hole 10b in the interlayer insulation film 10. Further, the first float wiring 12 is electrically connected to the first float layer 3b via the through hole 10a in the interlayer insulation film 10. The second float wiring 13 is electrically connected to the second float layer 3c via the contact hole 10c formed in the interlayer insulation film 10. The third float wiring 14 is electrically connected to the third float layer 3d via the contact hole 10d formed in the interlayer insulation film 10. The gate wiring 11 is electrically connected to the doped poly silicon layer 9 formed on the insulation film 8 via the contact hole 10e in the interlayer insulation film 10. The emitter electrode 15 is electrically connected to the emitter region 5 and the P type channel layer 3a via the contact hole 10f formed in the interlayer insulation film 10.

A collector electrode 16 is formed on the backside of the substrate 1. Thus, the semiconductor device having the IGBT is completed.

In the device, the gate electrode 7a is electrically connected to the gate wiring 11, to which the gate voltage is applied. The dummy gate electrodes 7b, 7c is electrically connected to the first float wiring 12, which is connected to the first float layer 3b. Further, the second float layer 3c is electrically connected to the second float wiring 13. Furthermore, the third float layer 3d is electrically connected to the third float wiring 14.

Since the dummy gate electrodes 7b, 7c are electrically connected to the first float layer 3b, the switching surge voltage and the switching loss are balanced.

The first to third float layers 3b-3d are not connected to the same wiring, but connected to different wirings. Accordingly, when the device turns off, contact portions between the first to third float layers 3b-3d and the wirings 12-14 have different electric potentials, respectively. Thus, for example, an electric potential difference between the contact portion and a part of the first float layer 3b is not changed and is very small even when the part of the first float layer 3b is space apart from the contact portion between the first float layer 3b and the first float wiring 12. Here, the part of the first float layer 3b is disposed on an inner side of the device, as shown in FIG. 3. Thus, the part of the first float layer 3b has substantially the same electric potential as the contact portion between the first float layer 3b and the first float wiring 12. Similarly, the part of the second float layer 3c apart from the contact portion between the second float layer 3c and the second float wiring 13 has substantially the same electric potential as the contact portion. The part of the third float layer 3d apart from the contact portion between the third float layer 3d and the third float wiring 14 has substantially the same electric potential as the contact portion.

For example, in the conventional device, when the first to third float layers 3b-3d contact the same wiring, the contact portions among the first to third float layers 3b-3d and the wiring have different electric potentials such that the electric potential P1 of the first float layer 3b at the first contact portion between the first float layer 3b and the wiring is equal to the electric potential P2 of the second float layer 3c at the second contact portion between the second float layer 3c and the wiring, and equal to the electric potential P3 of the third float layer 3d at the third contact portion between the third float layer 3d and the wiring. Further, in the conventional device, the electric potential P1 of another part of the first float layer 3b spaced apart from the first contact portion is smaller than the electric potential P2 of another part of the second float layer 3c spaced apart from the second contact portion, and smaller than the electric potential P3 of another part of the third float layer 3d spaced apart from the third contact portion. Thus, in the conventional device, the electric potential difference between the other part and the first contact portion of the first float layer 3b is larger as the distance between the other part and the first contact portion becomes larger. Similarly, the electric potential difference in the second float layer 3c is larger as the distance from the second contact portion becomes larger, and the electric potential difference in the third float layer 3d is larger as the distance from the third contact portion becomes larger. However, in this embodiment, the electric potential P1 of a part of the first float layer 3b is smaller than the electric potential P2 of a part of the second float layer 3c, and smaller than the electric potential P3 of a part of the third float layer 3d even when the part coincides with the contact portion or the part is spaced apart from the contact portion. Specifically, this relationship maintains everywhere in the first to third float layers 3b-3d.

Accordingly, there is no difference of electric potential in the first to third float layers 3b-3d along with the longitudinal direction. Accordingly, when the device switches, the operation of the device is stable, and each part of the device functions homogeneously. The break down voltage is improved. Specifically, reduction of the break down voltage caused by current concentration is prevented. Not only the dummy gate electrodes 7b, 7c arranged between two adjacent channel layers 3a but also the dummy gate electrodes 7b, 7c arranged on an outer side are electrically connected to each other via the first float wiring 12. Alternatively, only the dummy gate electrodes 7b, 7c arranged between two adjacent channel layers 3a may be connected to each other via the doped poly silicon layer 9 and the like, and the dummy gate electrodes 7b, 7c arranged on the outer side may be electrically separated from the dummy gate electrodes 7b, 7c arranged between two adjacent channel layers 3a.

Second Embodiment

In a second embodiment, the gate electrode 7a, the dummy gate electrodes 7b, 7c and the first to third float layers 3b-3d are differently connected to each other, compared with the device in FIGS. 1-4.

Figure 5:
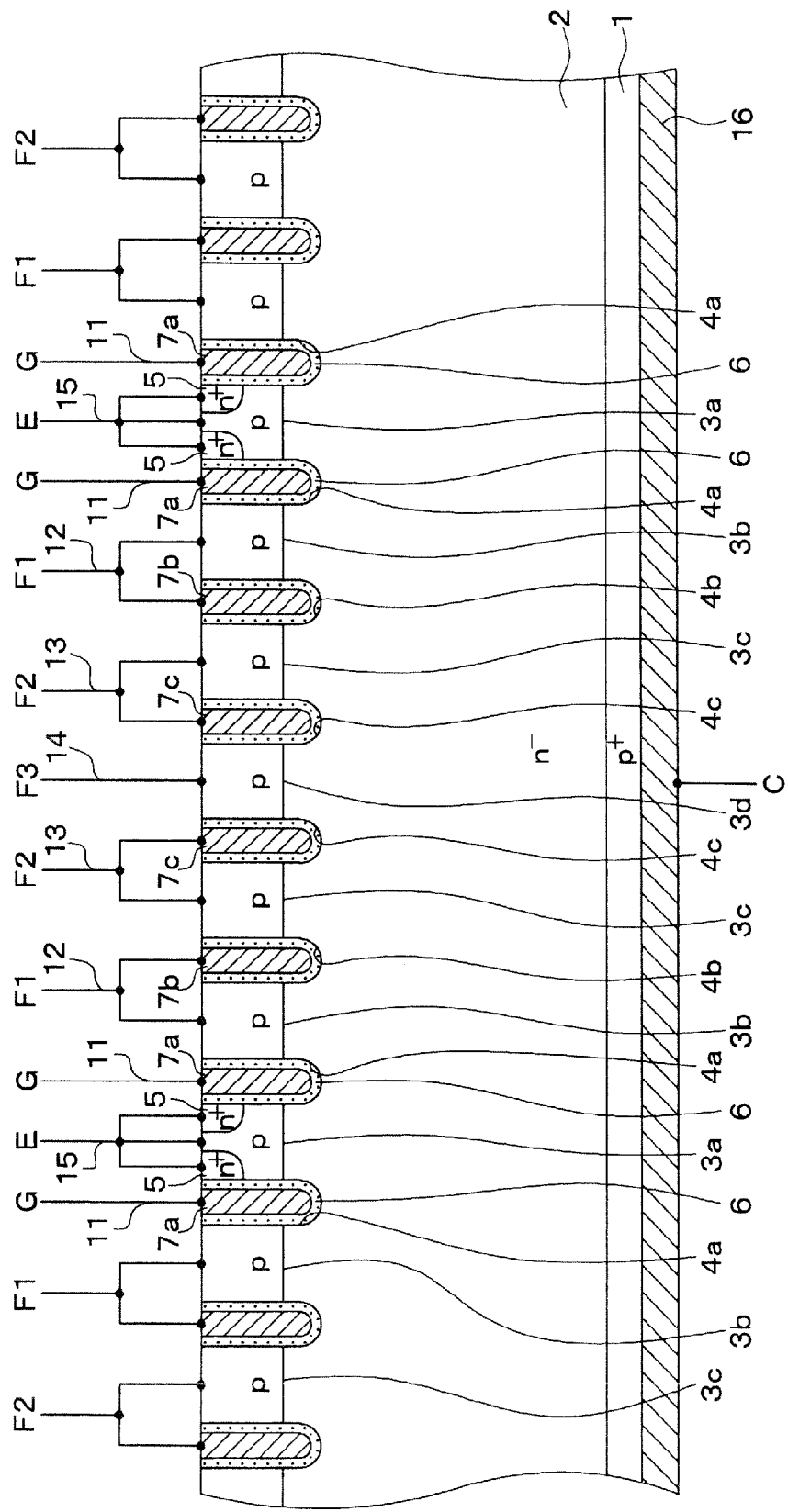
FIG. 5 is a cross sectional view showing a semiconductor device according to a second embodiment.
Figure 6:
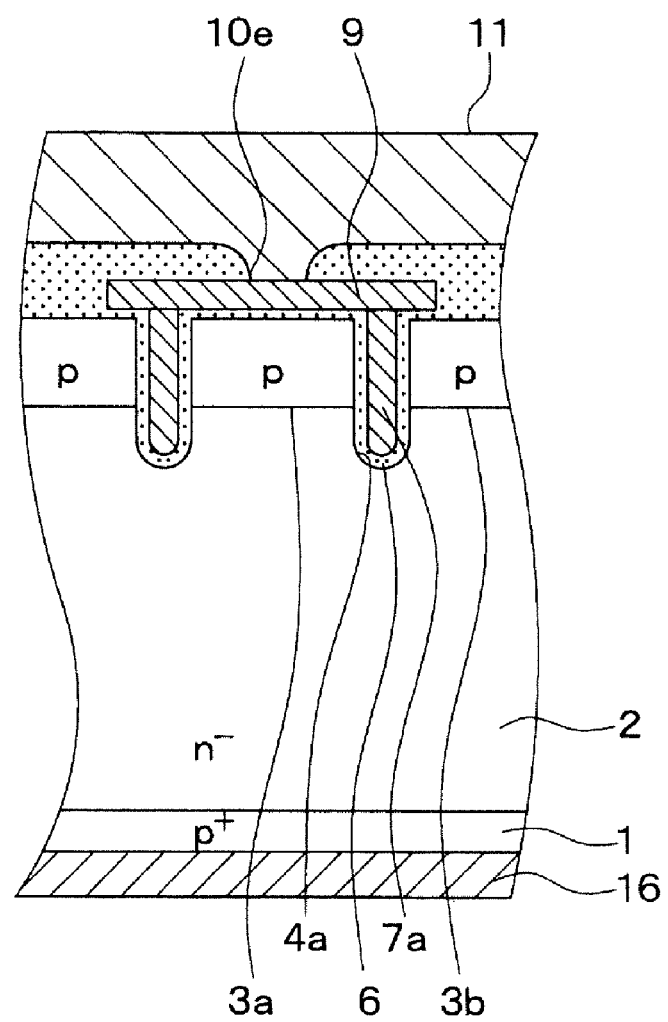
FIG. 6 is another cross sectional view showing the semiconductor device in FIG. 5.
Figure 7:
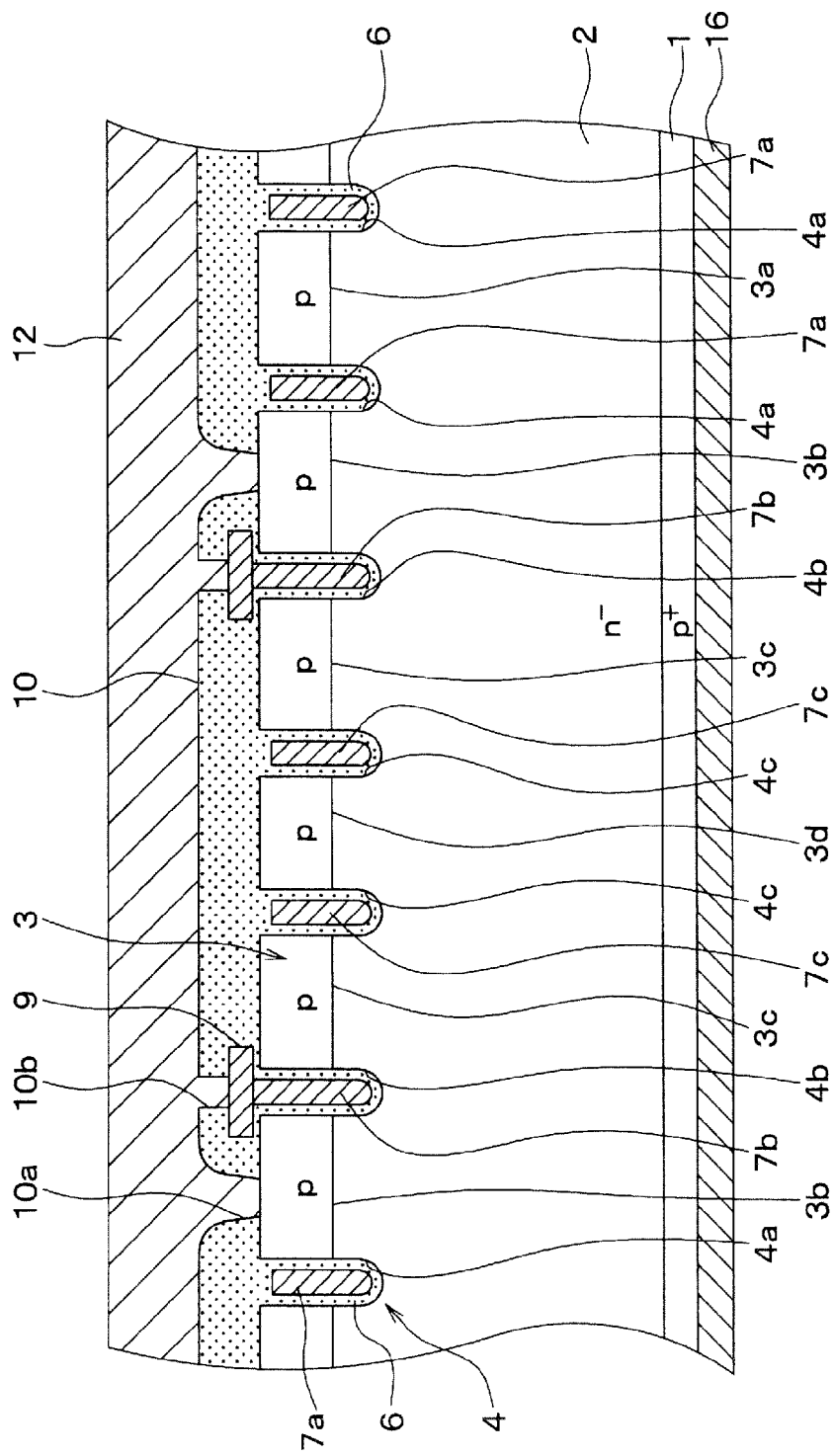
FIG. 7 is another cross sectional view showing the semiconductor device in FIG. 5.
Figure 8:
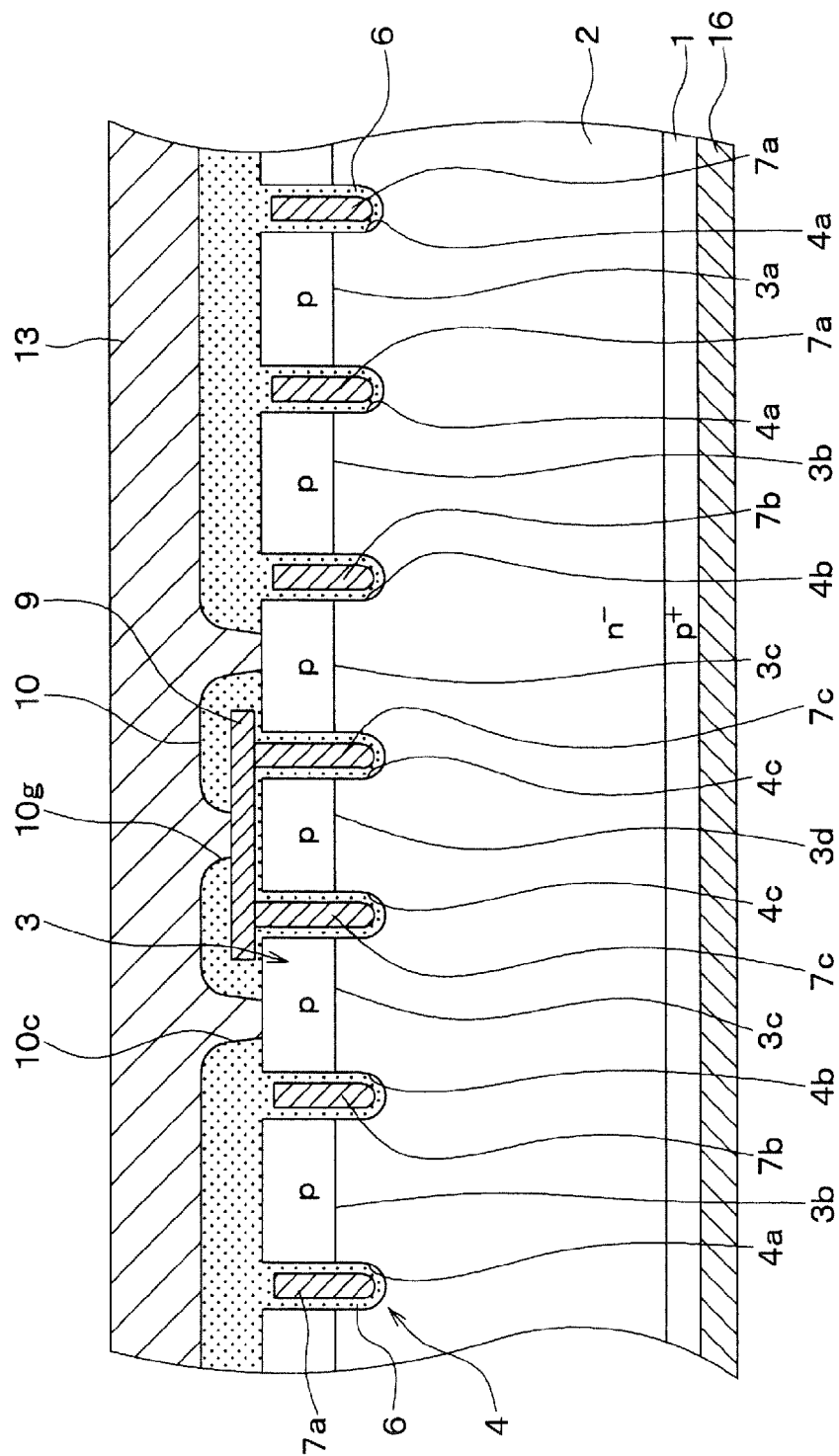
FIG. 8 is another cross sectional view showing the semiconductor device in FIG. 5.
Figure 9:
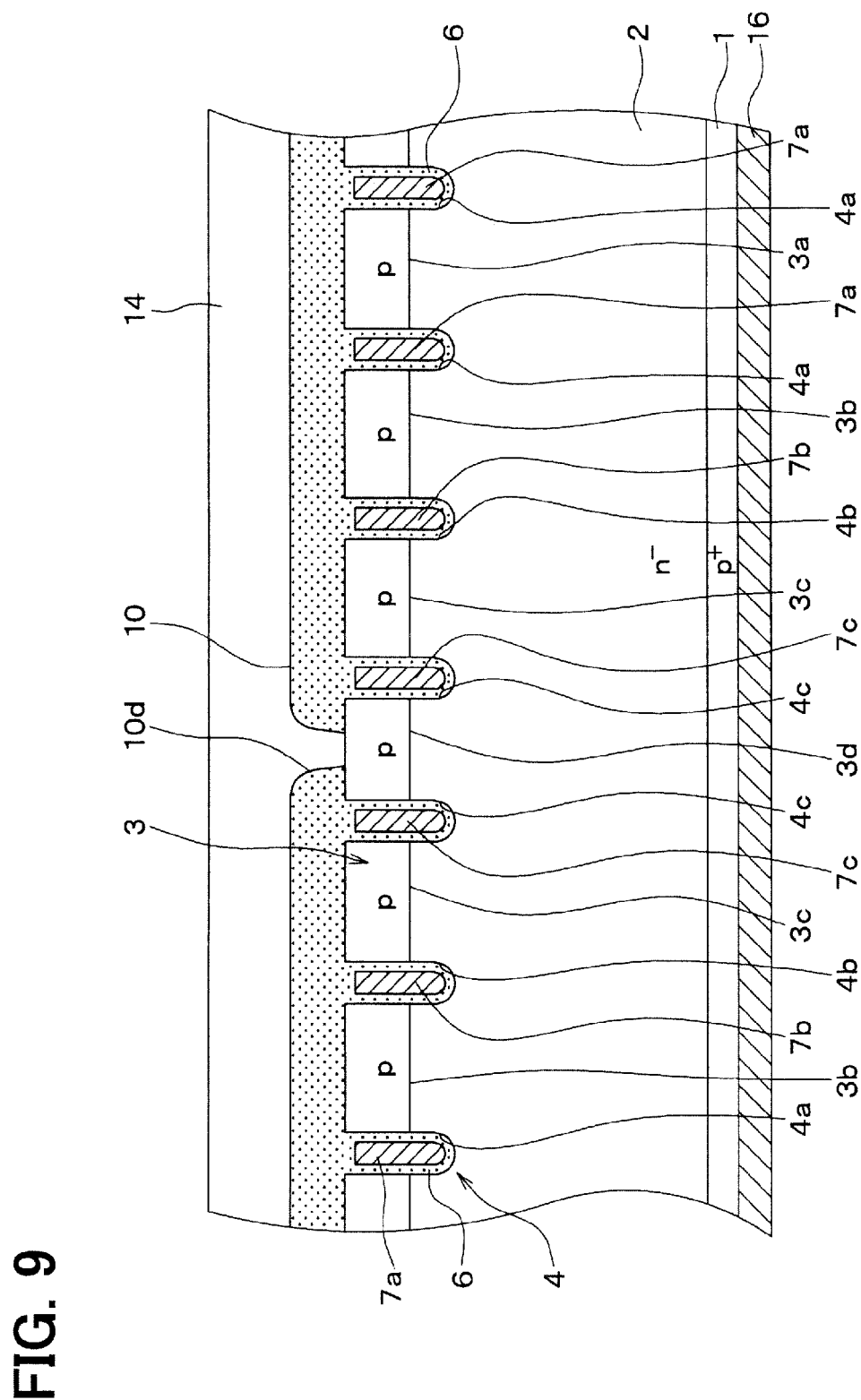
FIG. 9 is another cross sectional view showing the semiconductor device in FIG. 5.
Figure 10:
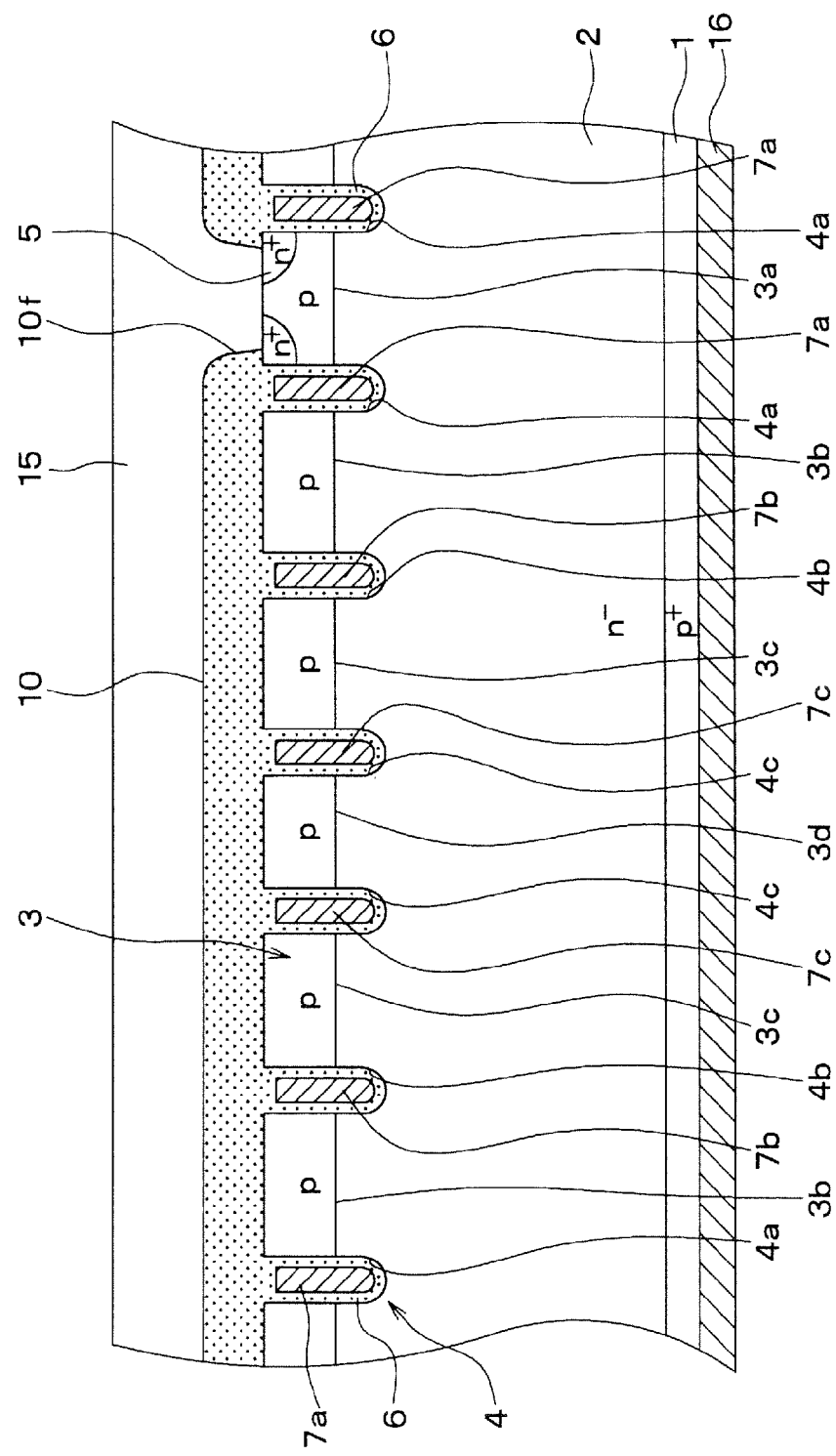
FIG. 10 is another cross sectional view showing the semiconductor device in FIG. 5.
Figure 11:
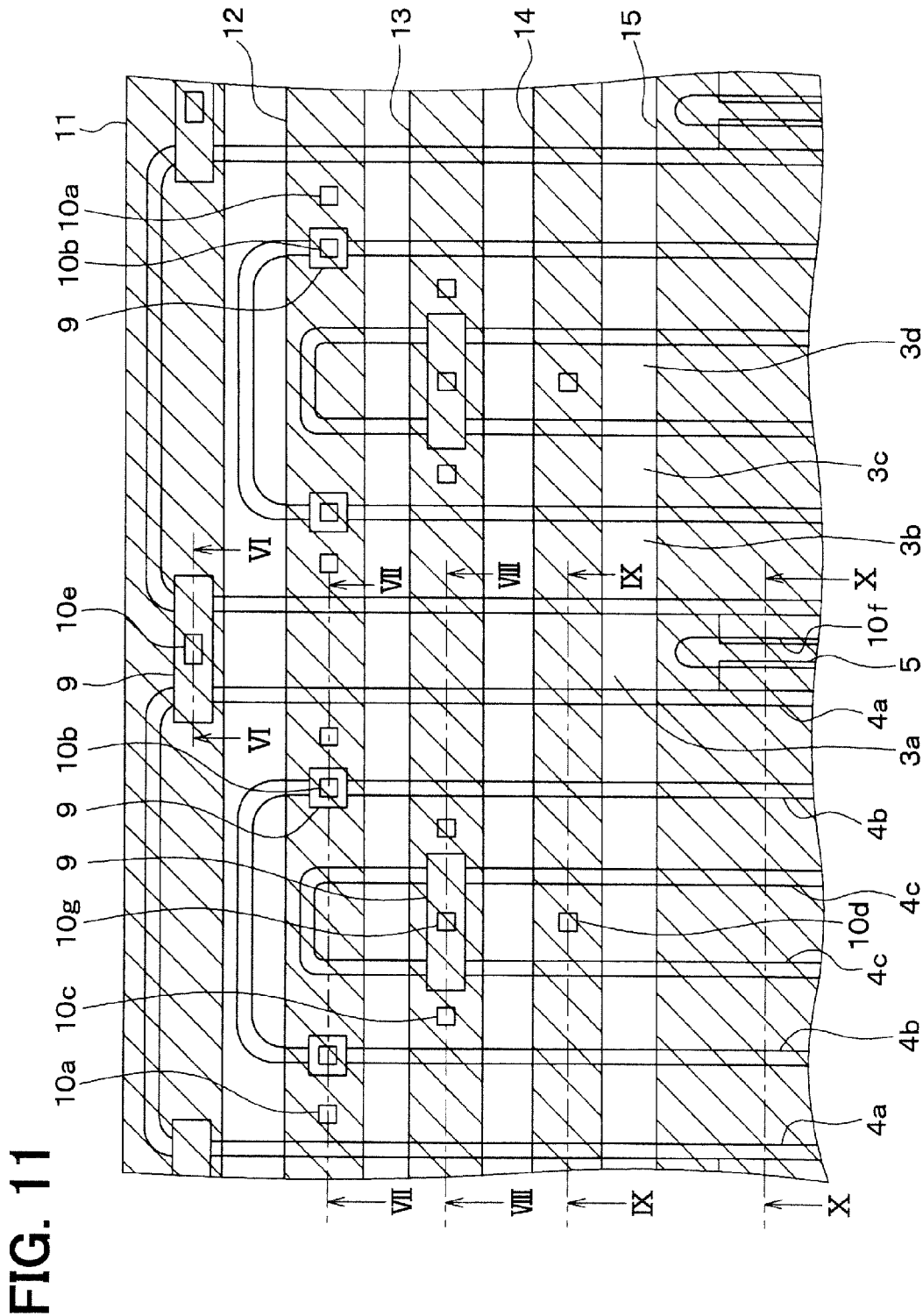
FIG. 11 is an upper plan view showing the semiconductor device in FIG. 5.

FIG. 5 shows a semiconductor device according to the second embodiment. FIG. 6 is a cross sectional view of the device taken along line VI-VI in FIG. 11, FIG. 7 is a cross sectional view of the device taken along line VII-VII in FIG. 11, FIG. 8 is a cross sectional view of the device taken along line VIII-VIII in FIG. 11, FIG. 9 is a cross sectional view of the device taken along line IX-IX in FIG. 11, and FIG. 10 is a cross sectional view of the device taken along line X-X in FIG. 11. FIG. 11 is not a cross sectional view, but a hatching is drawn in FIG. 11 to easily understand the drawing.

As shown in FIG. 5, the dummy gate electrode 7b formed in the first inner trench 4b is electrically connected to the first float layer 3b and the first float wiring 12. Further, the dummy gate electrode 7c formed in the second inner trench 4c is electrically connected to the second float layer 3c and the second float wiring 13. The third float layer 3d is electrically connected to the third float wiring 14. Thus, the dummy gate electrode 7b closest to the channel layer 3a among the dummy gate electrodes 7b, 7c is electrically connected to the first float layer 3b closes to the channel layer 3a among the first to third float layers 3b-3dn and further connected to the first float wiring 12. The dummy gate electrode 7c furthest from the channel layer 3a among the dummy gate electrodes 7b, 7c is electrically connected to the second float layer 3c furthest from the channel layer 3a among the first to third float layers 3b-3dn and further connected to the second float wiring 13. As shown in FIG. 11, the gate wiring 11, the first to third float wirings 12-14 and the emitter electrode 15 are arranged similar to those in FIG. 3. Contact holes for connecting to each part and the doped poly silicon layer 9 are arranged differently from those in FIG. 3. Thus, the above electric connections are obtained.

In this embodiment, the device includes the first float wiring 12 for electrically connecting the dummy gate electrodes 7b, 7c and the first float layer 3b, the second float wiring 13 for electrically connecting to the second float layer 3c, and the third float wiring 14 for electrically connecting to the third float layer 3d. Alternatively, the device may not include the second float wiring 13 and the third float wiring 14. In this case, the second float layer 3c and the third float layer 3d have floating potential.

As shown in FIG. 6, the gate wiring 11 is electrically connected to the doped silicon layer 9 on the insulation film 8 via the contact hole 10e in the interlayer insulation film 10. Further, as shown in FIG. 7, the first float wiring 12 is electrically connected to the doped poly silicon layer 9 on the insulation film 8 via the contact hole 10b in the interlayer insulation film 10. Further, the first float wiring 12 is electrically connected to the first float layer 3b via the contact hole 10a. As shown in FIG. 8, the second float wiring 13 is electrically connected to the second float layer 3c via the contact hole 10b formed in the interlayer insulation film 10. Further, the second float wiring 13 is electrically connected to the doped poly silicon layer 9 on the insulation film 8 via the contact hole 10g in the interlayer insulation film 10. As shown in FIG. 9, the third float wiring 14 is electrically connected to the third float layer 3d via the contact hole 10d in the interlayer insulation film 10. As shown in FIG. 10, the emitter electrode 15 is electrically connected to the N$^+$ type emitter region 5 and the P type channel layer 3a via the contact hole 10f in the interlayer insulation film 10.

When the device turns off, the electric potential P1 of the first float layer 3b is equal to the electric potential of the gate electrode 7a, the electric potential of the gate electrode 7a is smaller than the electric potential P2 of the second float layer 3c, the electric potential P2 of the second float layer 3c is equal to the electric potential of the dummy gate electrode 7b, the electric potential of the dummy gate electrode 7b is smaller than the electric potential P3 of the third float layer 3d, and the electric potential P3 of the third float layer 3d is equal to the electric potential of the dummy gate electrode 7c. Accordingly, the relationship among the electric potentials P1-P3 of the first to third float layers 3b-3d is maintained at any position along with the longitudinal direction of the trench 4. Thus, when the device switches, the operation of the device is homogeneously performed. The break down voltage reduction by the current concentration is prevented.

Third Embodiment

In a semiconductor device according to a third embodiment, the arrangement of the gate wiring 11, the first to third float wirings 12-14 and the emitter electrode 15 is different from that according to the first and second embodiments.

Figure 12:
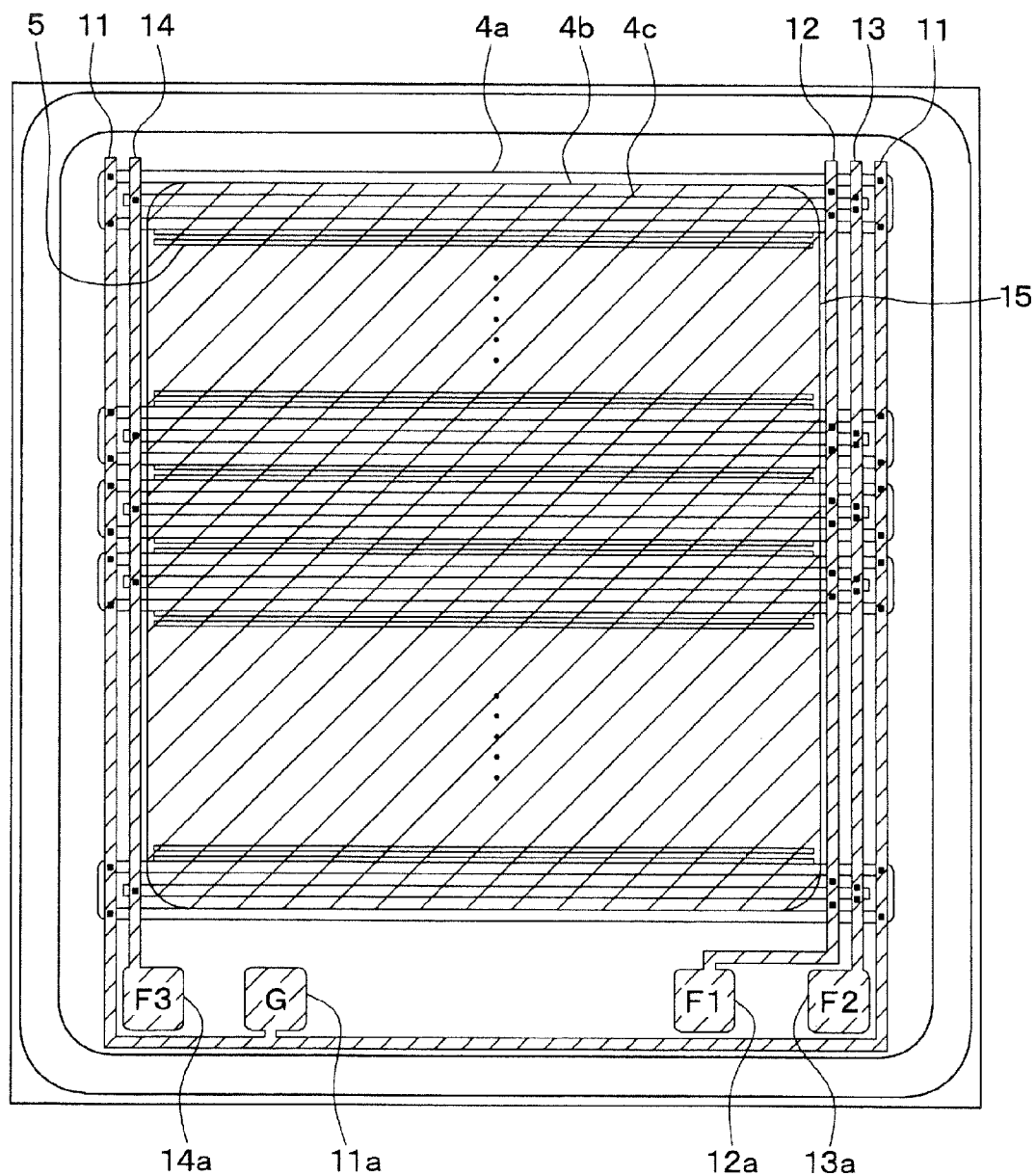
FIG. 12 is an upper plan showing a semiconductor device according to a third embodiment.

FIG. 12 shows the semiconductor device having an IGBT according to this embodiment. FIG. 12 is not a cross sectional view, but, in FIG. 12, the view is partially hatched to easily understand the drawing. The first to third float wirings are disposed on both sides of the emitter electrode 15 so that they sandwich the emitter electrode 15. Further, the gate wiring 11 is disposed on both sides of the emitter electrode 15 and the first to third float wirings 12-14 so that the gate wiring 11 sandwiches the emitter electrode 15 and the first to third float wirings 12-14. The device further includes a gate pad 11a for connecting the gate wiring 11 and an external circuit, a first float pad 12a for connecting the first float wiring 12 and the external circuit, a second float pad 13a for connecting the second float wiring 13 and the external circuit, a third float pad 14a for connecting the third float wiring 14 and the external circuit. The gate pad 11a and the first to third float pads 12a-14a are disposed on an outside of the cell so that they are spaced apart from the trench 4.

The above device shows the same effects as the first and second embodiments. Further, a breaking test may be performed via the pads 11a-14a. For example, a predetermined voltage is applied between the gate pad 11a and the first float pad 12a so that a leak current is tested. Thus, it is determined whether the first float wiring 12 is isolated from the emitter electrode 15. Similarly, a voltage is applied between the first float pad 12a and the second float pad 13a so that a leak current is tested. Thus, it is determined whether the first float wiring 12 is isolated from the second float wiring 13. Further, a voltage is applied between the second float pad 13a and the third float pad 14a so that a leak current is tested. Thus, it is determined whether the second float wiring 13 is isolated from the third float wiring 14. These tests provide to determine whether imbalance between the electric potentials of the first to third float layers 3b-3d is generated by a defect of a trench gate structure.

Fourth Embodiment

In a semiconductor device according to a fourth embodiment, the connection among the gate electrode 7a, the dummy electrodes 7b, 7c and the first to third float layers 3b-3d is different from that according to the first to third embodiments.

Figure 13:
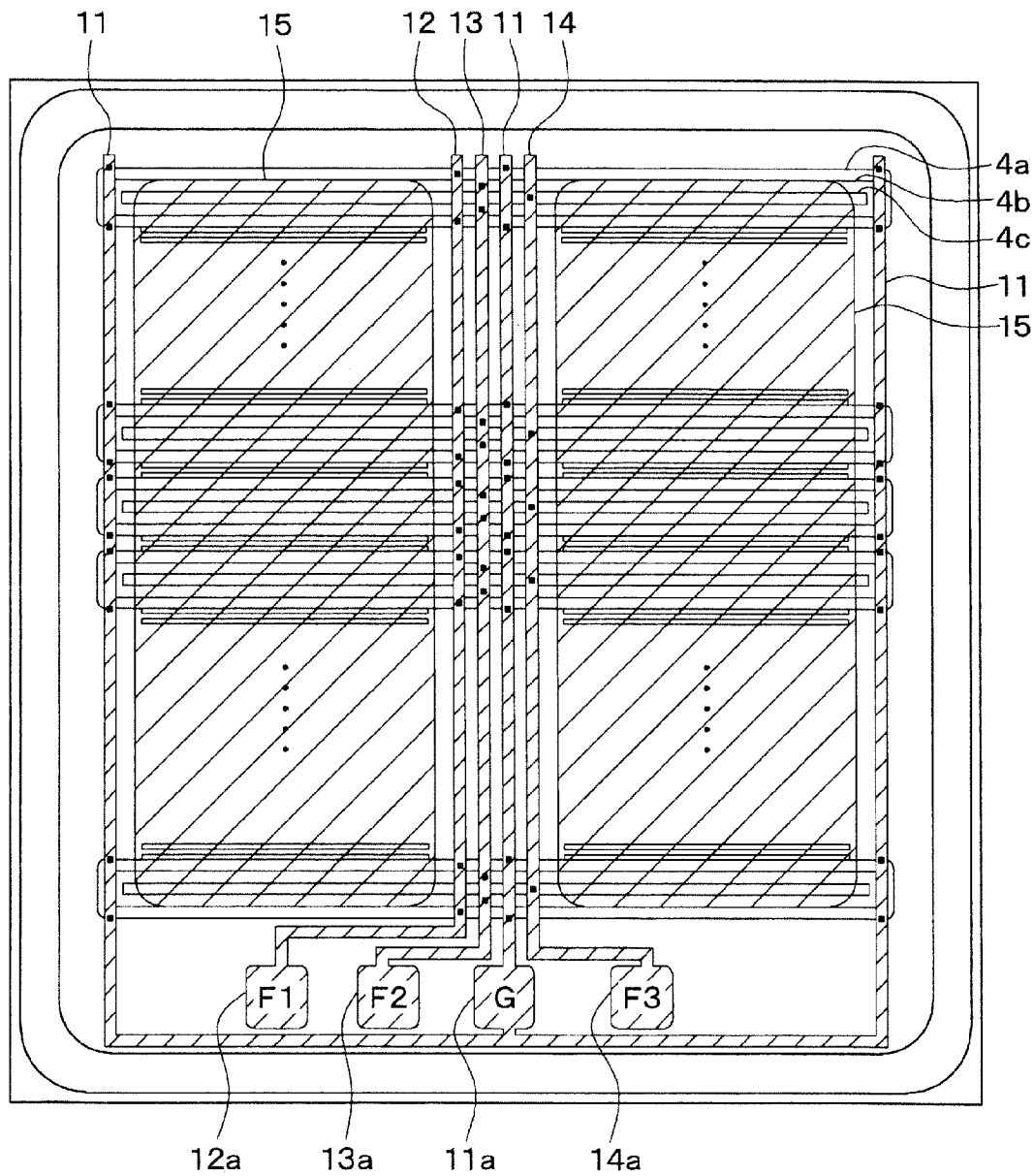
FIG. 13 is an upper plan showing a semiconductor device according to a fourth embodiment.

FIG. 13 shows the semiconductor device having an IGBT according to this embodiment. FIG. 13 is not a cross sectional view, but, in FIG. 13, the view is partially hatched to easily understand the drawing. The emitter electrode 15 is divided into two parts at the center of the trench 4 in the longitudinal direction. The gate wiring 11 and the first to third float wirings 12-14 are arranged between two parts of the emitter electrode 15. Further, the gate wiring 11 is also disposed on an end of the trench 4 in the longitudinal direction.

The dummy gate electrodes 7b, 7c are made of doped poly silicon, and the gate electrode 7a is made of doped poly silicon. Thus, the dummy gate electrodes 7b, 7c have a low resistance. When a chip size of the device is small, e.g., the chip size is equal to or smaller than a 5 millimeters square, each of the first to third float wirings 12-14 is connect to the dummy gate electrodes 7b 7c and the gate electrode 7a at a top end of the trench 4 in the latitudinal direction. When the chip size becomes larger, the imbalance of the electric may be generated by delay of transmission of the electric potential. In the above device, the imbalance caused by the delay of transmission of the electric potential in the dummy gate electrodes 7b, 7c is prevented. Further, the above device shows the same effects as the first to third embodiments.

Modifications

In the first to fourth embodiments, a ratio between the number of the channel layer 3a and the number of the float layers 3b-3d is constant, and the channel layer 3a and the float layers 3b-3d are repeatedly arranged in a predetermined order. Thus, a thinning ratio, i.e., a ratio between a forming rate of the channel layer 3a and a forming rate of the float layers 3b-3d is constant. Specifically, the multiple ring structure has triple rings, so that he channel layer 3a and the first to third float layers 3b-3d are formed. Thus, the thinning ratio is 5:1. Alternatively, the thinning ratio may be another fraction.

Figure 14:
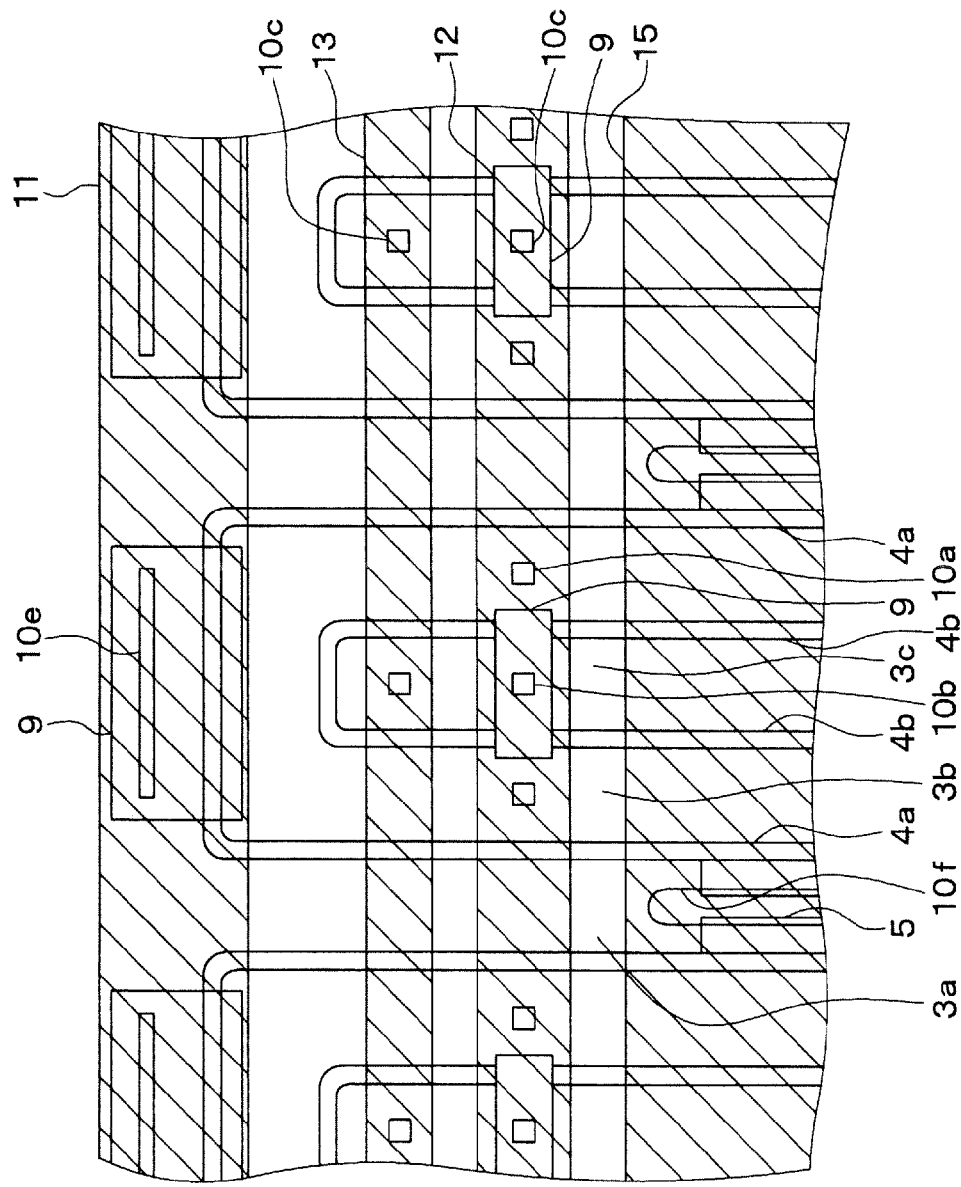
FIG. 14 is an upper plan view showing a semiconductor device according to a modification of the first embodiment.
Figure 15:
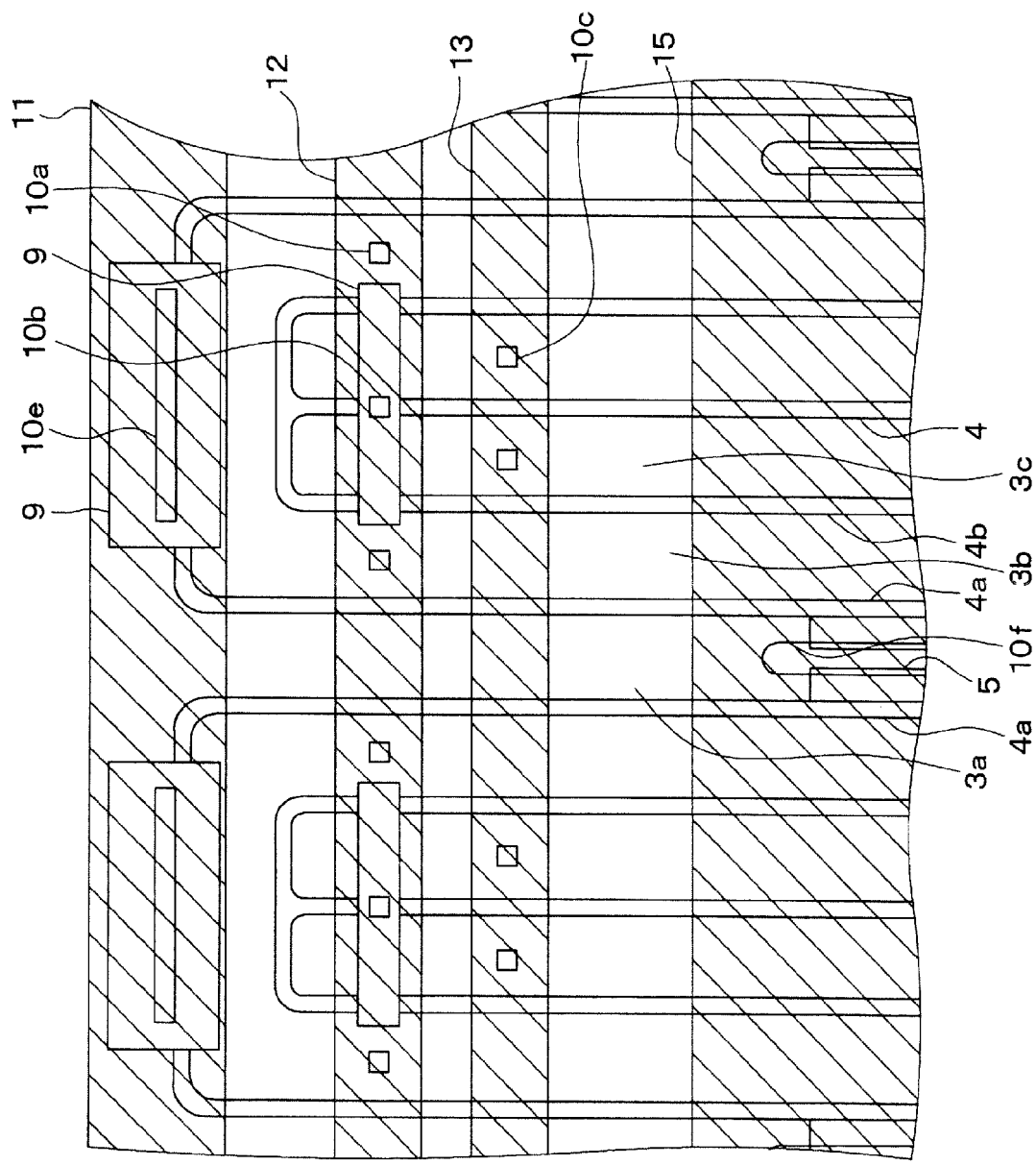
FIG. 15 is an upper plan view showing a semiconductor device according to another modification of the first embodiment.
Figure 16:
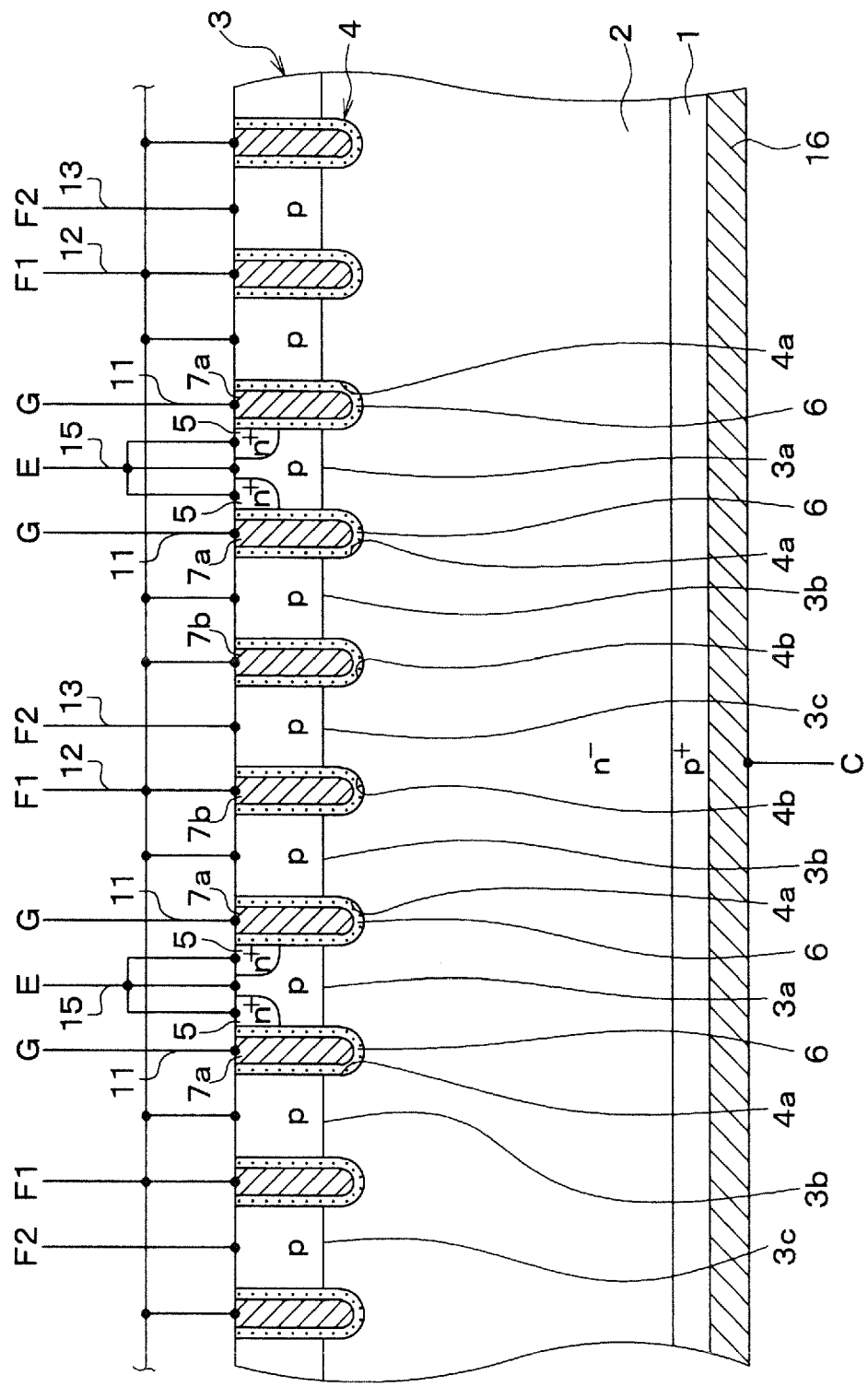
FIG. 16 is a cross sectional view showing the semiconductor device in FIG. 14.
Figure 17:
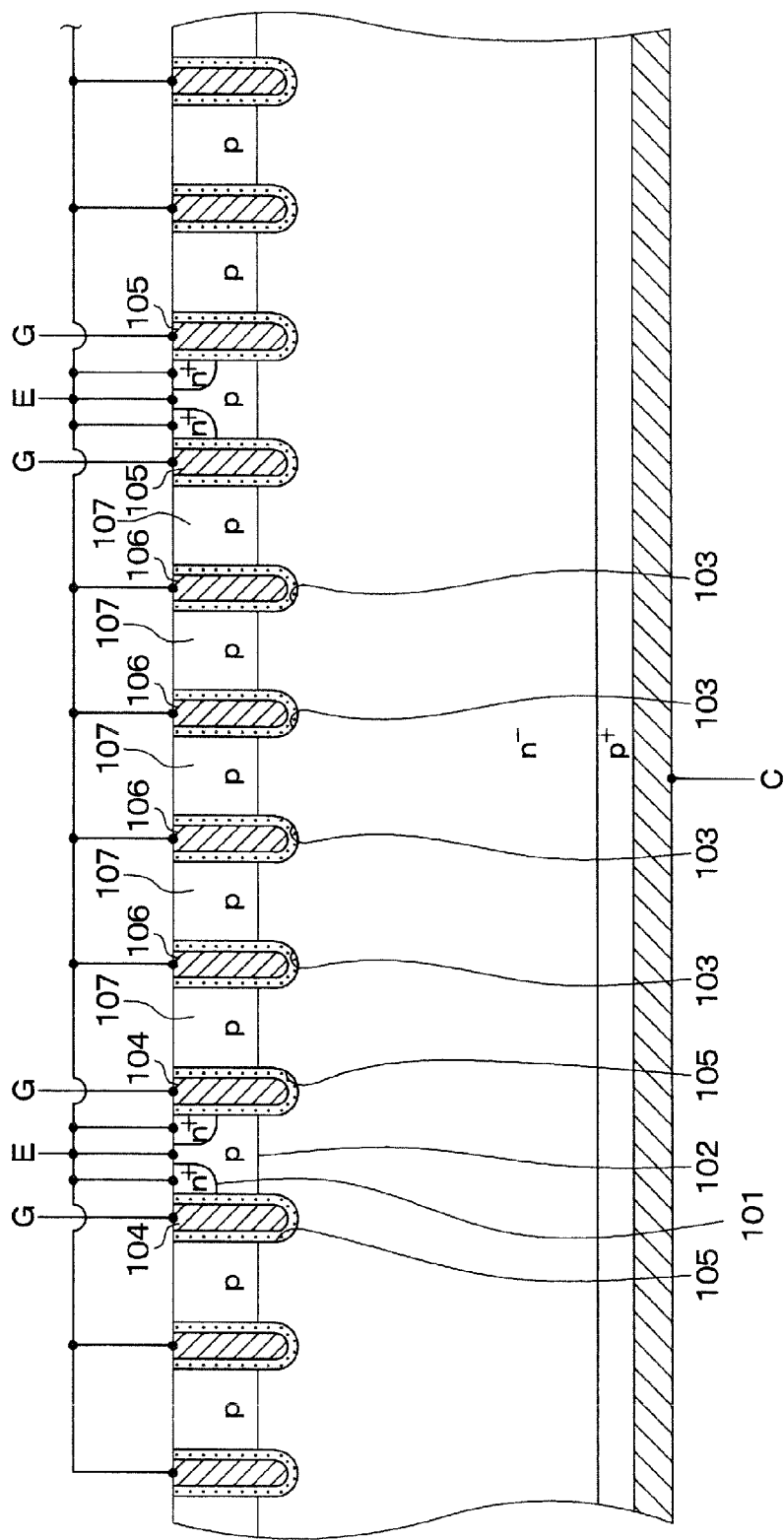
FIG. 17 is a cross sectional view showing a semiconductor device having a dummy gate electrode connecting to a gate electrode according to a prior art.
Figure 18:
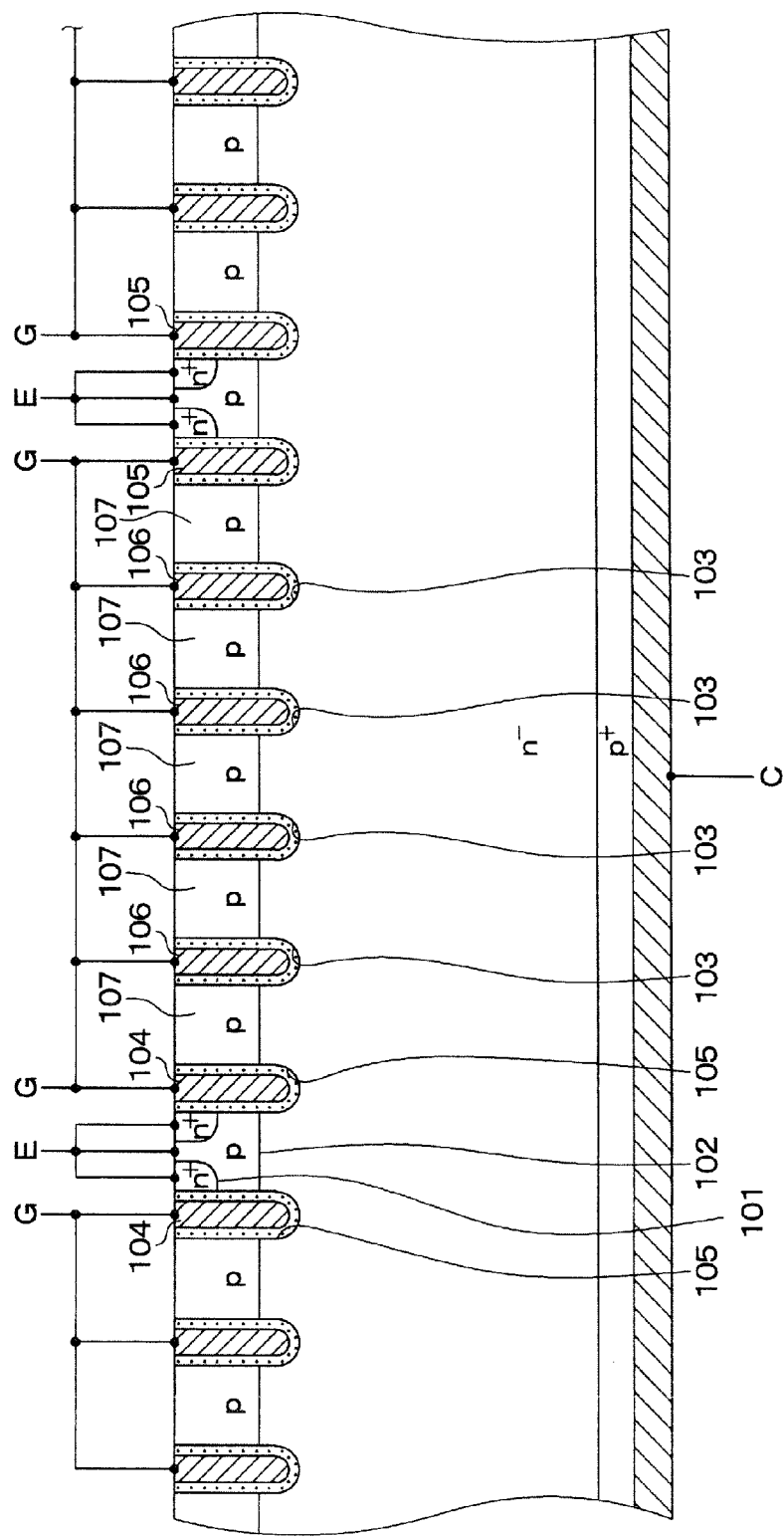
FIG. 18 is a cross sectional view showing a semiconductor device having a dummy gate electrode connecting to an emitter electrode according to the prior art.

FIG. 14 shows a semiconductor device having the thinning ratio of 3:1. FIG. 15 shows a semiconductor device having the thinning ratio of 4:1. FIG. 16 shows a semiconductor device having the thinning ratio of 3:1.

When the thinning ratio is 3:1, the device includes the first and second float wirings 12, 13. The dummy gate electrode 7b is formed in the first inner trench 4b, and the dummy gate electrode 7b is electrically connected to the first float layer 3b and the first float wiring 12. The second float layer 3c is electrically connected to the second float wiring 13.

As shown in FIG. 15, the first inner trench 4b further includes three trenches 4, one of which is arranged at the center of the first inner trench 4b. Thus, the second float layer 3c is divided into two parts. The device includes the first and second float wirings 12, 13. The dummy gate electrode 7b formed in the first inner trench 4b is electrically connected to the first float layer 3b and the first float wiring 12. The second float layer 3c is electrically connected to the second float wiring 13.

In the devices shown in FIGS. 14-16, the device may not include the second float wiring 13. In this case, the second float layer 3c has a floating potential. Even when the device has the thinning ratio larger than 5:1, float layers other than the first float layer 3b may have a floating potential as long as the first float layer 3b is electrically connected to the dummy gate electrode 7b.

The devices according to the above embodiments includes the trench 4 having a ring shape, and the trench 4 provides to isolate the first to third float layers 3b-3d. Alternatively, the device may include the trench 4 having another layout as long as multiple float layers are adjacently arranged via the trench 4. For example, multiple float layers may have a stripe pattern.

Fifth and Sixth Embodiments

Figure 20:
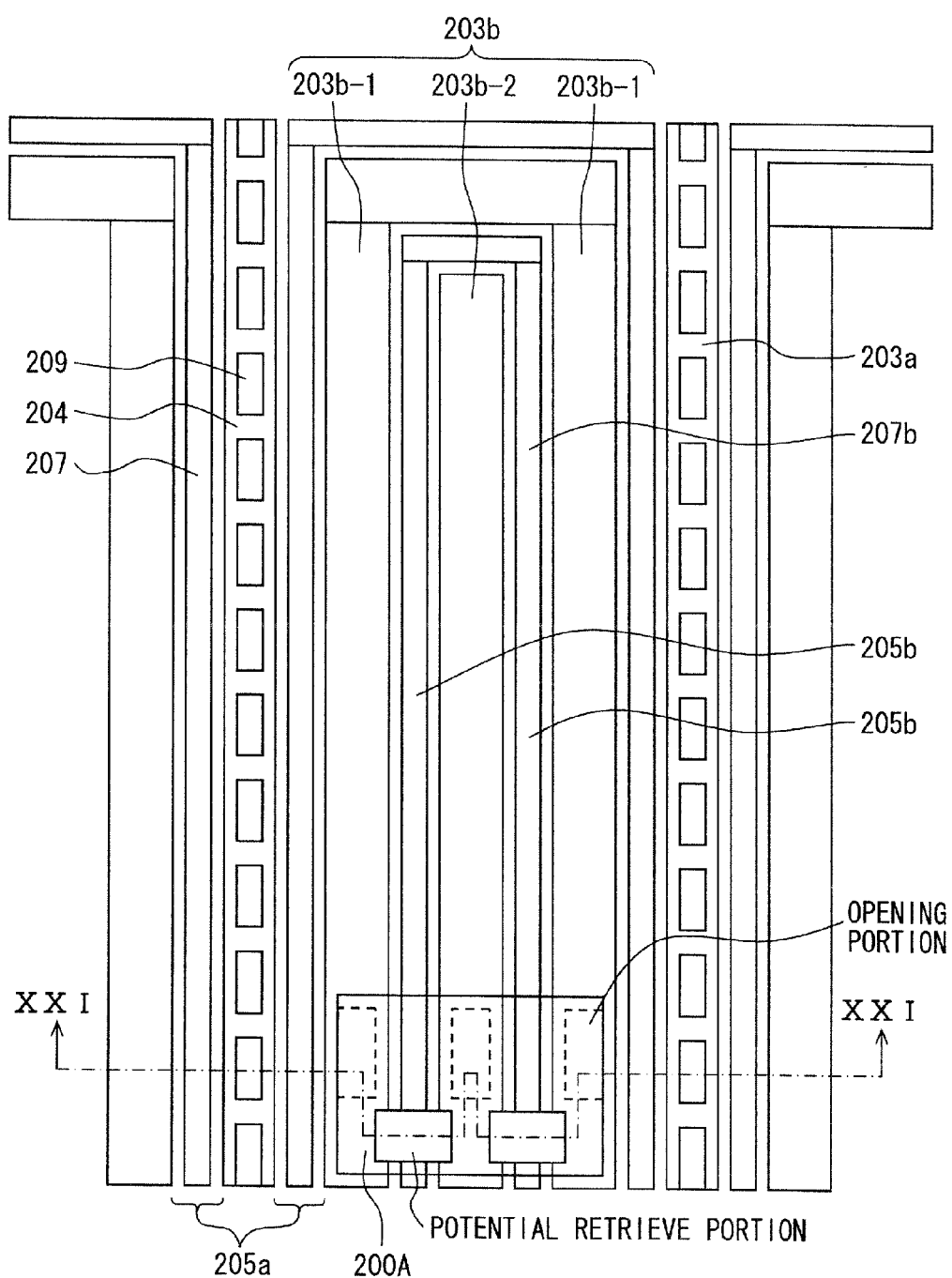
FIG. 20 is a plan view showing a trench type IGBT according to a fifth embodiment.
Figure 21:
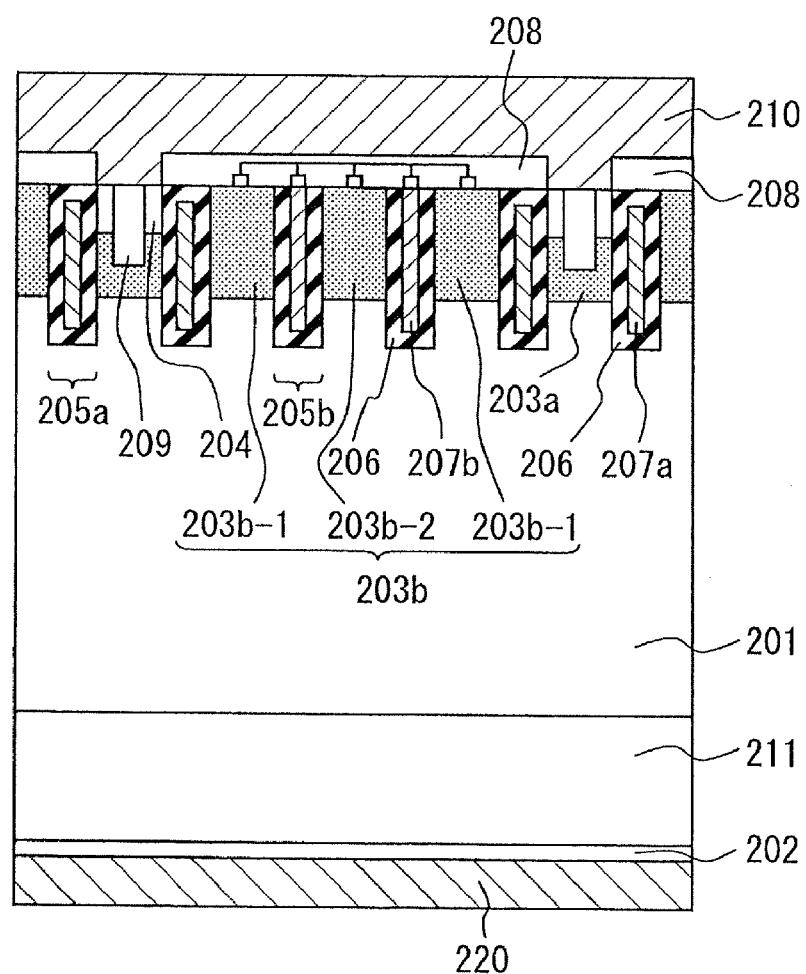
FIG. 21 is a cross sectional view showing the device taken along line XXI-XXI in FIG. 20.
Figure 22:
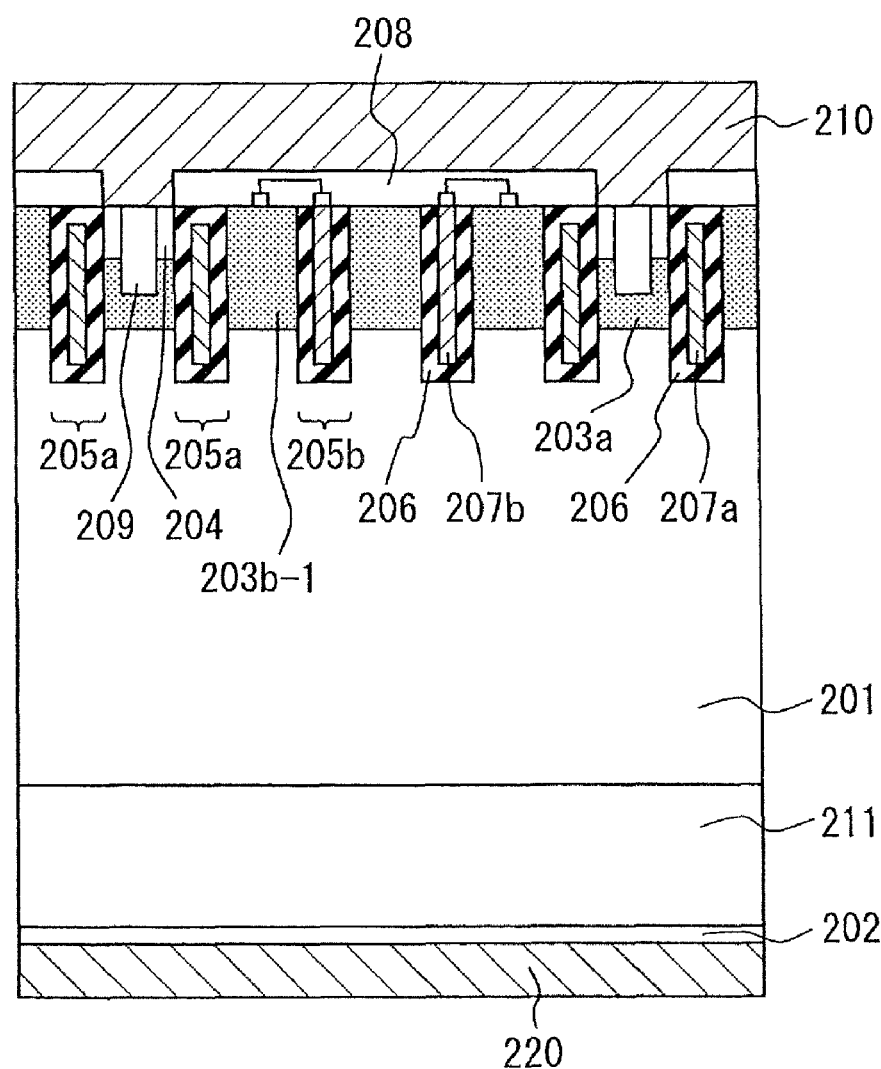
FIG. 22 is a cross sectional view showing a trench type IGBT according to a sixth embodiment.
Figure 23:
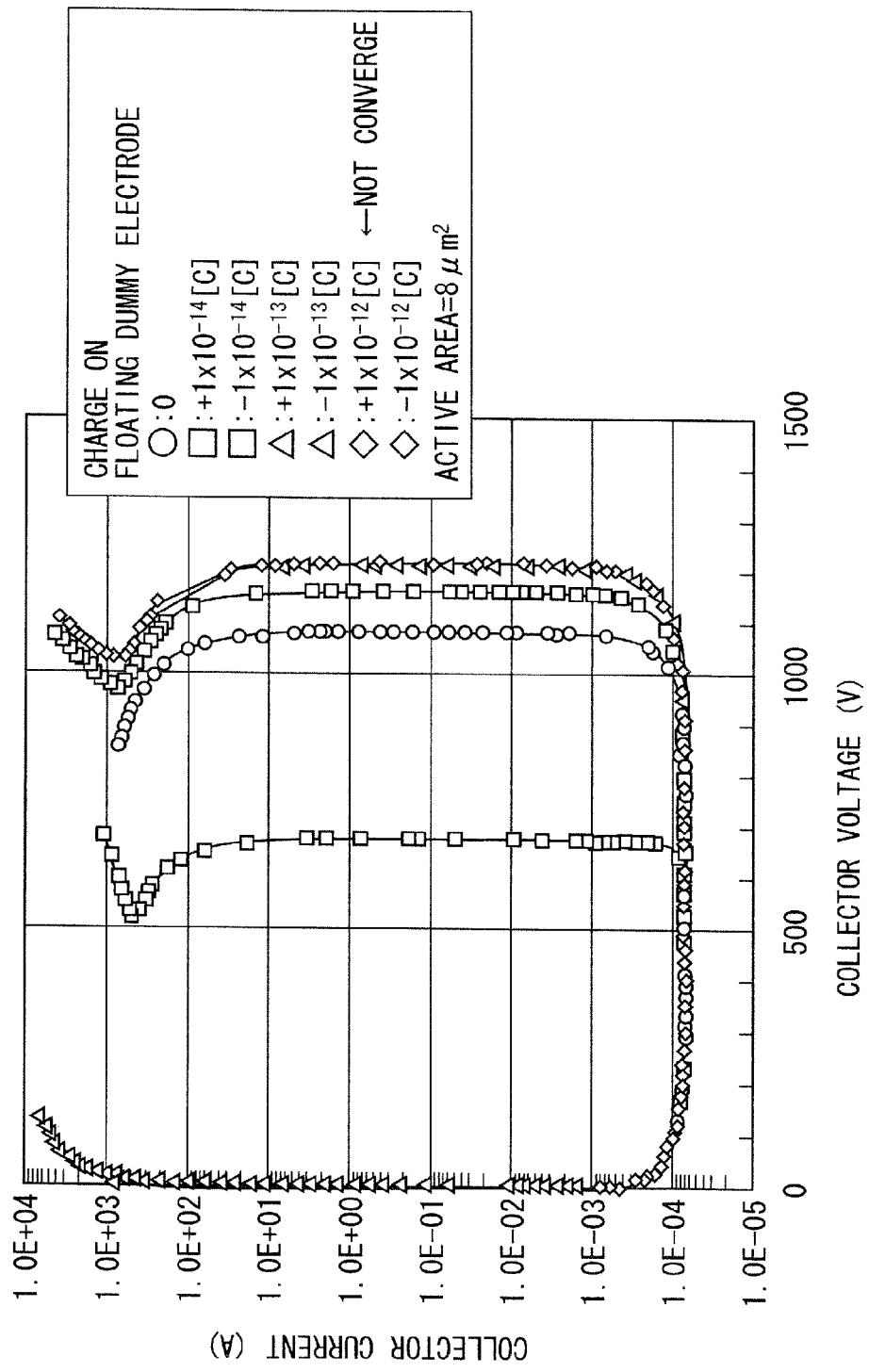
FIG. 23 is a graph showing static current-voltage characteristics of the trench type IGBT when a charge is applied to an embedded electrode and the embedded electrode is in a floating state.
Figures 24A, 24B:
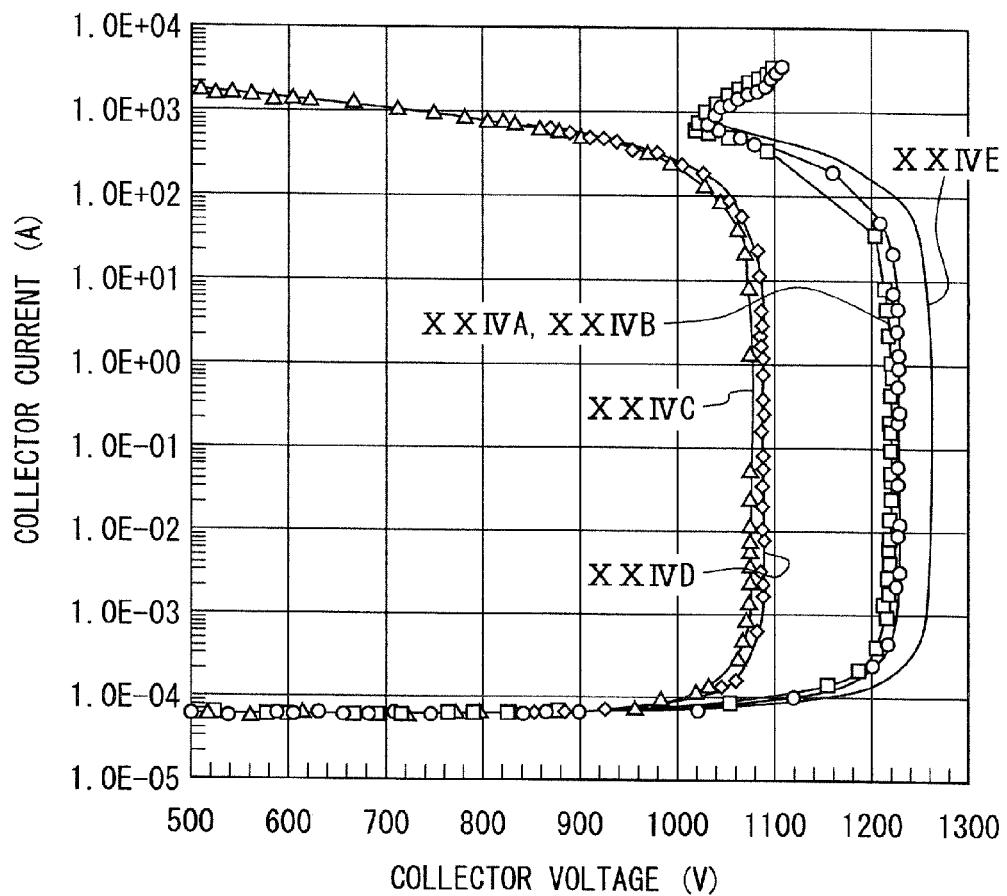
FIG. 24A is a graph showing static current-voltage characteristics of various trench type IGBTs having different surface structures.
FIG. 24B is a diagram showing $V_{CE}$max and $\Delta V_{CE}$ in various IGBTs.
Figure 25:
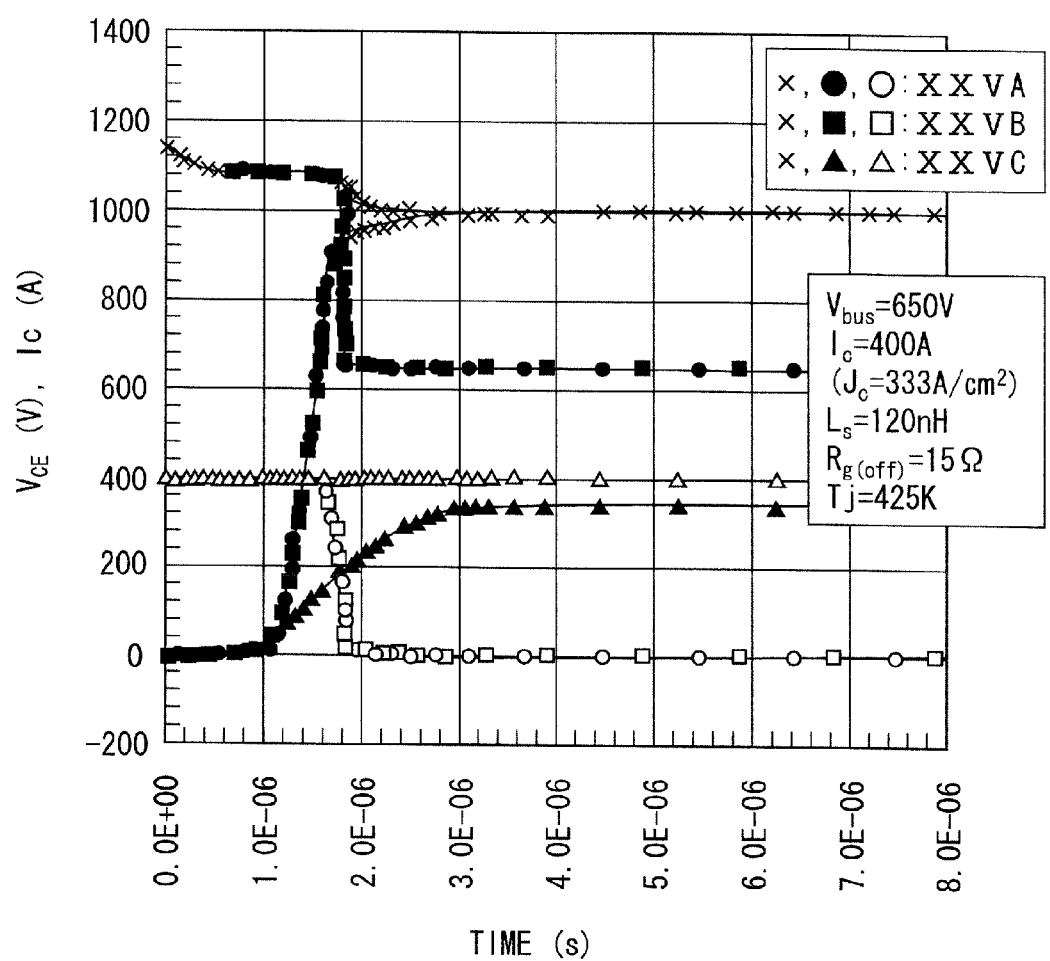
FIG. 25 is a graph showing a turn-off waveform in various IGBTs having different surface structures.
Figure 26A:
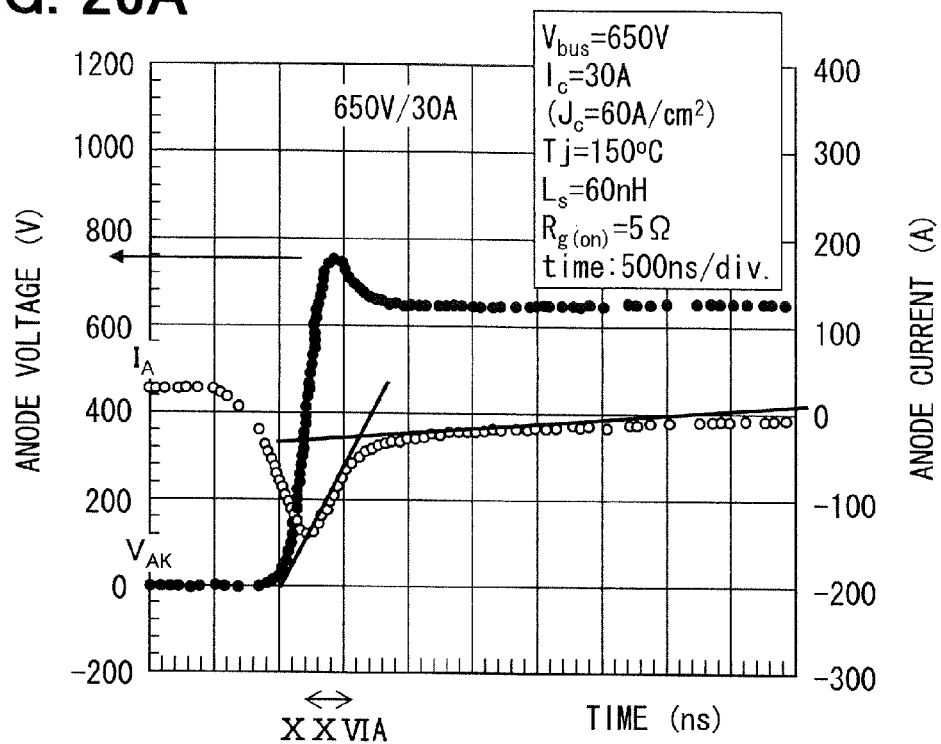
FIGS. 26A and 26B is a graph showing reverse recovery characteristics of a FWD (free wheel diode) connected to various IGBTs having different surface structures in case of small current.
Figure 26B:
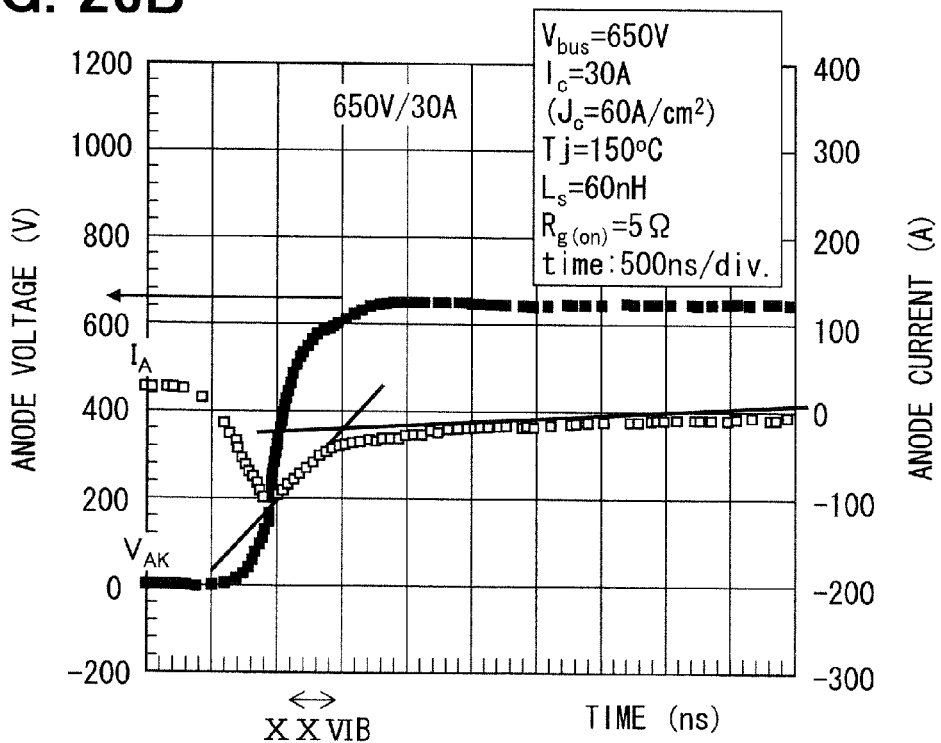
Figure 27A:
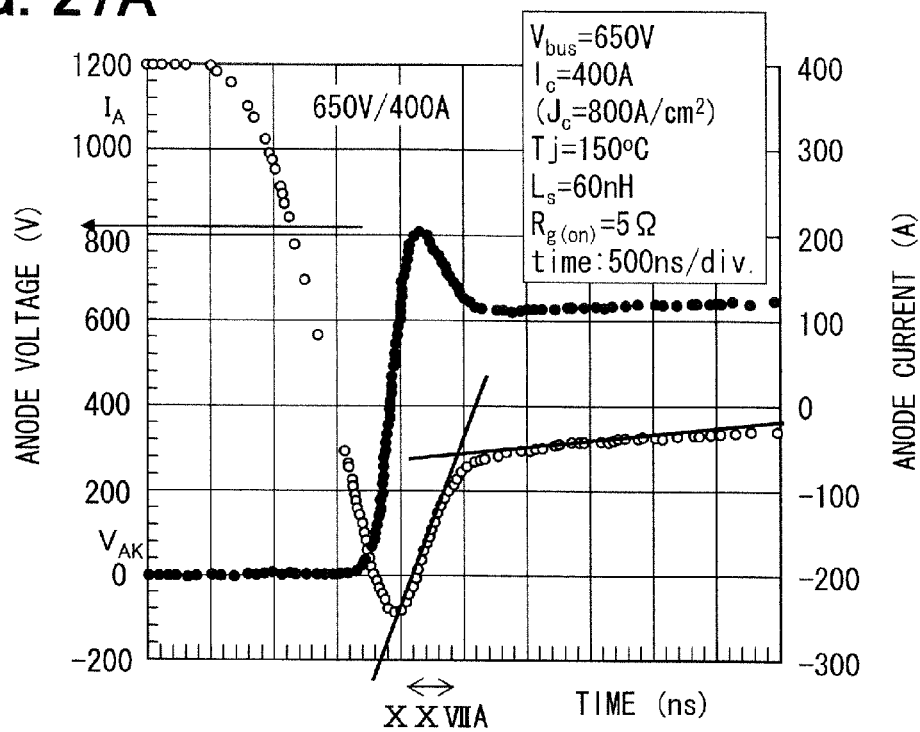
FIGS. 27A and 27B is a graph showing reverse recovery characteristics of a FWD (free wheel diode) connected to various IGBTs having different surface structures in case of large current.
Figure 27B:
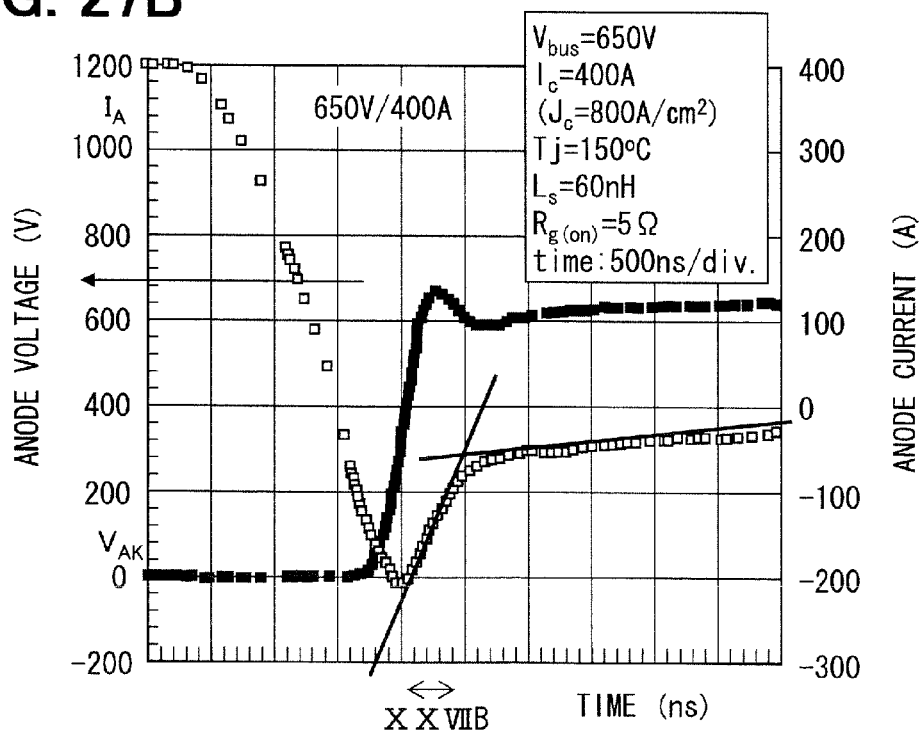
Figure 28:
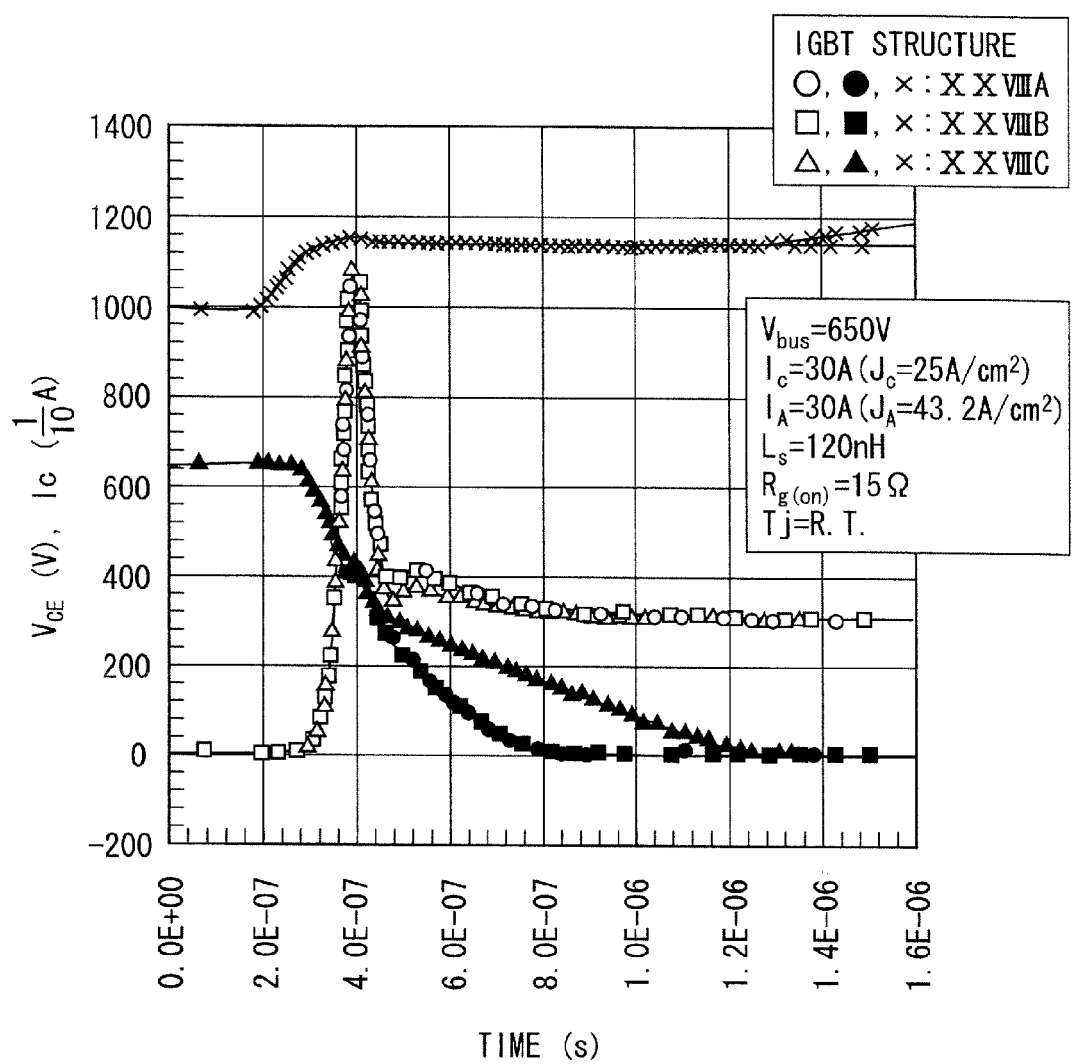
FIG. 28 is a graph showing a turn-on waveform of various IGBTs having different surface structures.
Figure 29:
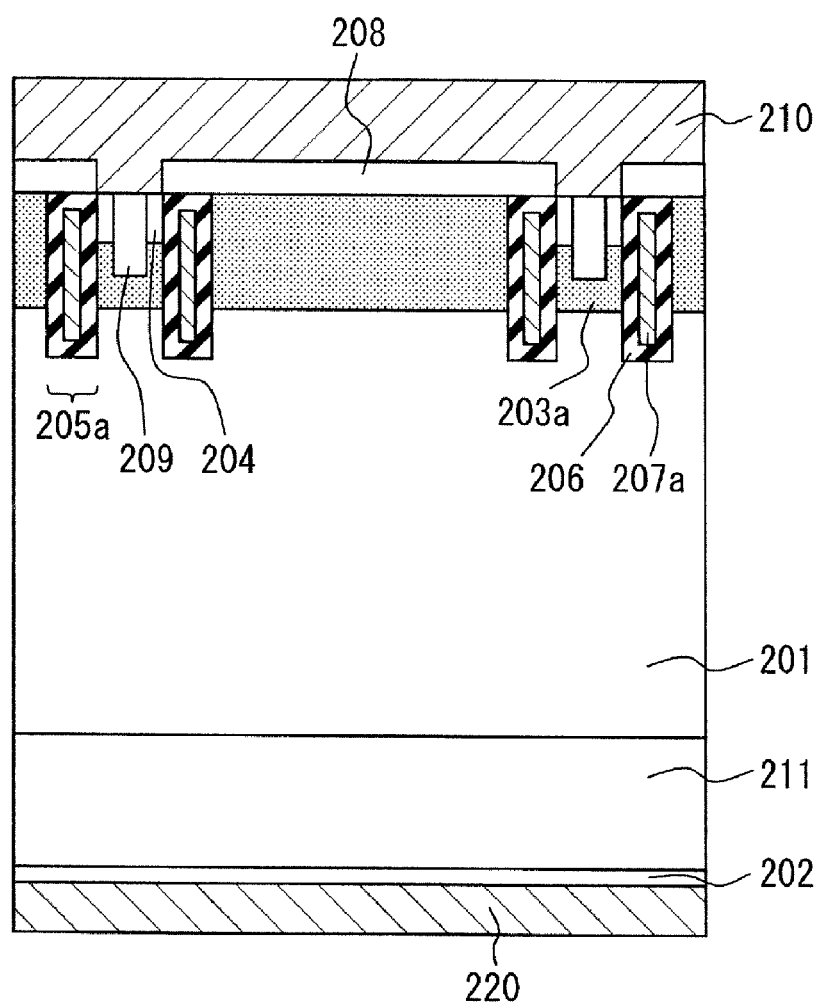
FIG. 29 is a cross sectional view showing an IGBT according to a prior art.

A trench gate type insulated gate bipolar transistor according to fifth embodiment is shown in FIGS. 20 and 21. FIG. 22 shows another trench gate type IGBT according to a sixth embodiment. FIG. 23 shows static current-voltage characteristics of a trench type IGBT when a charge is applied to an embedded electrode and the embedded electrode is in a floating state. FIGS. 24A and 24B show static current-voltage characteristics of various trench type IGBTs having different surface structures. FIG. 25 shows a turn off waveform of various trench type IGBTs having different surface structures. FIGS. 26A and 26B show reverse recover characteristics of FWDs (free wheel diode) connected in parallel to the trench type IGBTs having different surface structures when each IGBT turns on with a small current. FIGS. 27A and 27B show reverse recover characteristics of FWDs (free wheel diode) connected in parallel to the trench type IGBTs having different surface structures when each IGBT turns on with a large current. FIG. 28 shows a turn on waveform of the trench type IGBTs having different surface structures.

The trench type IGBT shown in FIGS. 20 and 21 will be explained. In FIG. 21, the IGBT includes an embedded electrode 207b and a second channel region 203b, which are electrically connected with a floating electrode 200A at a connection portion, which is shown as a wiring. The device shown in FIG. 21 is different from the device shown in FIG. 30. In the device shown in FIG. 21, the embedded electrode 207b formed in a second trench 205b via an insulation film 206 is electrically connected to a second channel segment region 203b-1, which is adjacent to the first trench 205a. A gate electrode 207a is embedded in the first trench 205a via an insulation film 206. The second channel region 203b is divided by the second trench 205b into three second channel segment regions 203b-1 to 203b-3. Two first trenches 205a between first channel regions 203a are coupled with each other at a periphery of the device. Two second trenches 205b between first channel regions 203a are coupled with each other at the periphery of the device. The embedded electrode 207b and two second channel segment regions 203b-1 are independently and electrically coupled with each other at respective portions disposed between the first channel regions 203a. Reference numeral 201 represents an N type base layer 201, reference numeral 202 represents a P type collector layer 202, reference numeral 203a represents a first channel region 203a, reference numeral 203b-2 represents another second channel segment region 203b-2, reference numeral 204 represents an N$^+$ type emitter region 204, reference numeral 208 represents an interlayer insulation film 208, reference numeral 209 represents a high impurity concentration P type body region 209, reference numeral 210 represents an emitter electrode 210, reference numeral 211 represents an N type buffer region or a field stop region, and reference numeral 220 represents a collector electrode 220. In another trench type IGBT shown in FIG. 22, the embedded electrode 207b is only connected to the second channel segment region 203b-1 adjacent to the first trench 205a.

A first advantage of the IGBTs shown in FIGS. 20-22 is such that the gate capacitance relating to the channel current supply becomes small since the embedded electrode 207b is electrically isolated from the gate electrode 207a. Thus, the devices show high speed switching.

A second advantage of the IGBTs is such that two second channel segment regions 203b-1 contacting both the second trench 205b and the first trench 205a have electric potentials, which are not fixed to a predetermined potential but equal to each other. Thus, electric field distribution in the devices becomes homogeneous. Further, the charge injected into the embedded electrode 207b flows into the N type base layer 201 via the second channel segment region 203b-1, so that break down voltage variation caused by the charge accumulated in the embedded electrode 207b is improved. In FIG. 23, a horizontal axis represents a collector voltage for a break down voltage, and a vertical axis represents a collector current. For example, 1.0E+04 represents $1.0 \times 10^4$. FIG. 23 corresponds to the trench type IGBT shown in FIG. 30, and the embedded electrode 207b is electrically isolated so that the embedded electrode 207b is in a floating state. Thus, the charge is easily accumulated in the embedded electrode 207b. FIG. 23 is a voltage current characteristic graph showing an off-state waveform between the collector and the emitter with different accumulated charges as a parameter of a simulation. In the IGBT shown in FIG. 30, the break down voltage largely depends on the positive charge in the embedded electrode 207b. In some cases, the IGBT may be broken as a switching breakdown.

Figure 30:
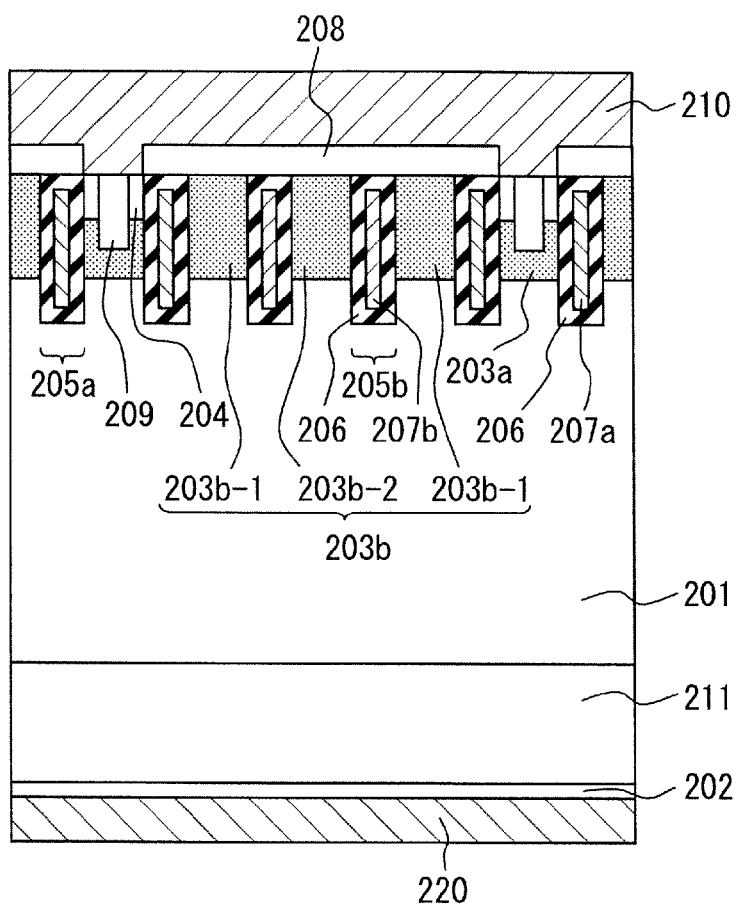
FIG. 30 is a cross sectional view showing another IGBT according to a related art.
Figure 31:
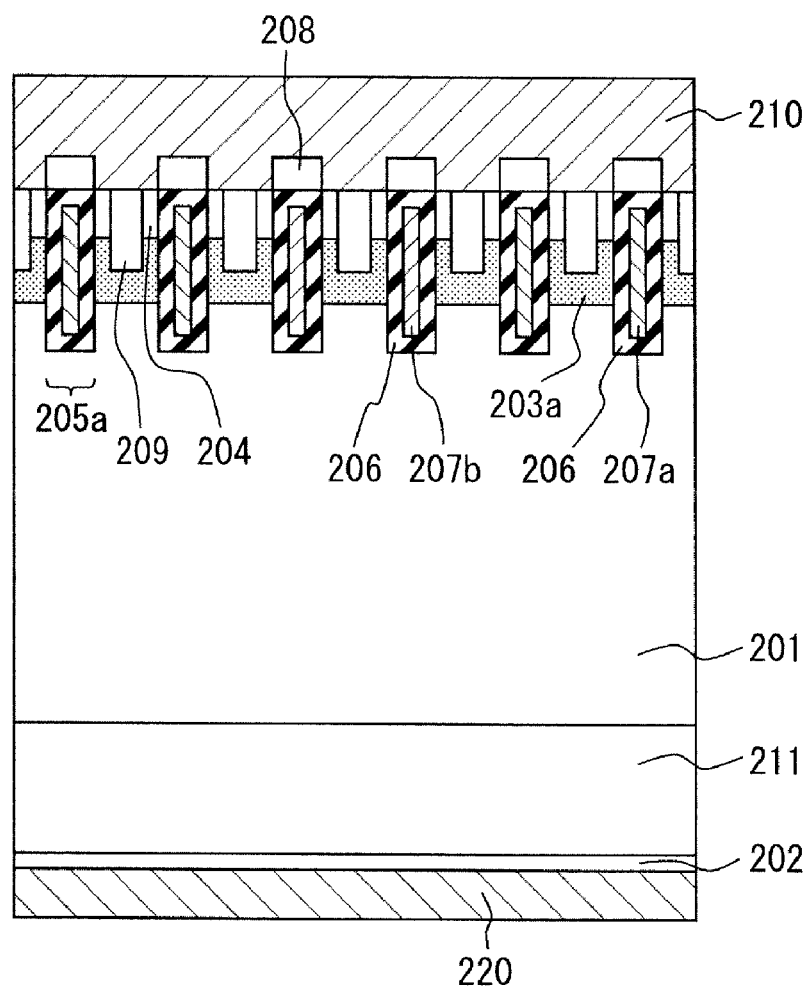
FIG. 31 is a cross sectional view showing another IGBT according to the prior art.
Figure 32:
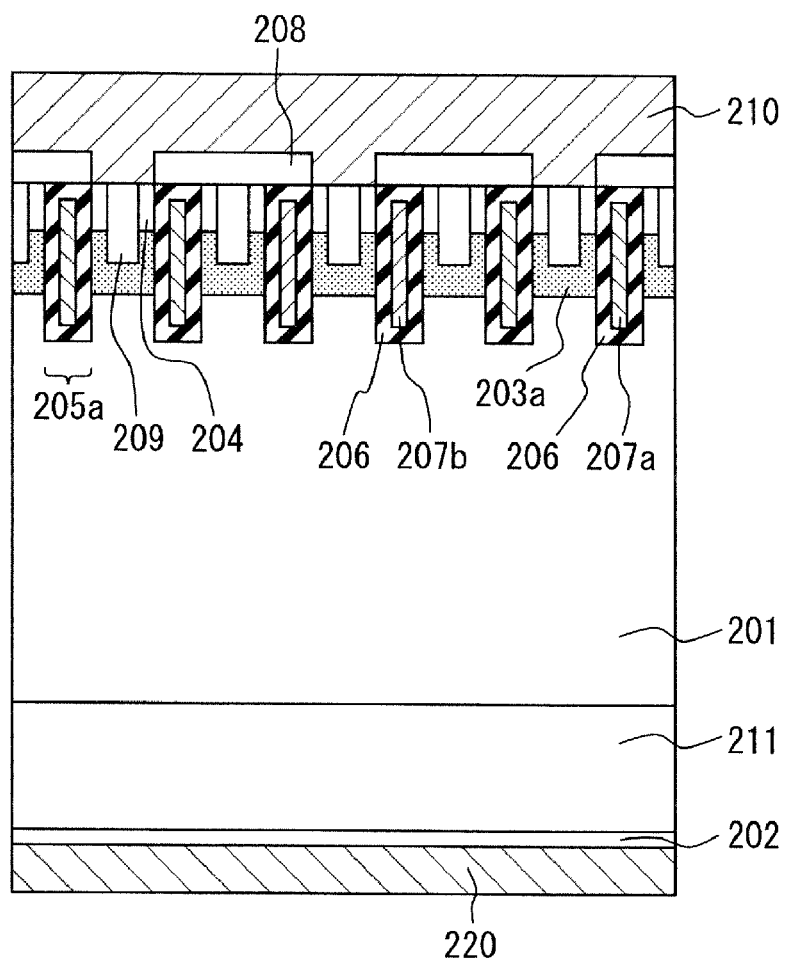
FIG. 32 is a cross sectional view showing another IGBT according to the prior art.
Figure 33:
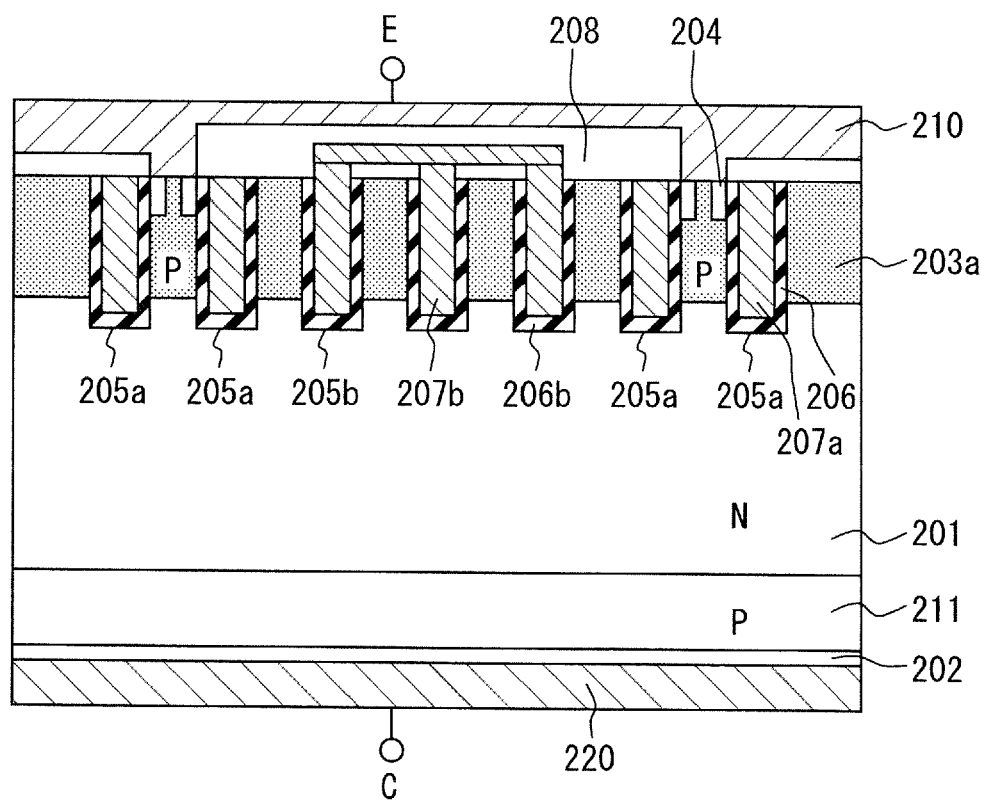
FIG. 33 is a cross sectional view showing another IGBT according to the prior art.
Figure 34:
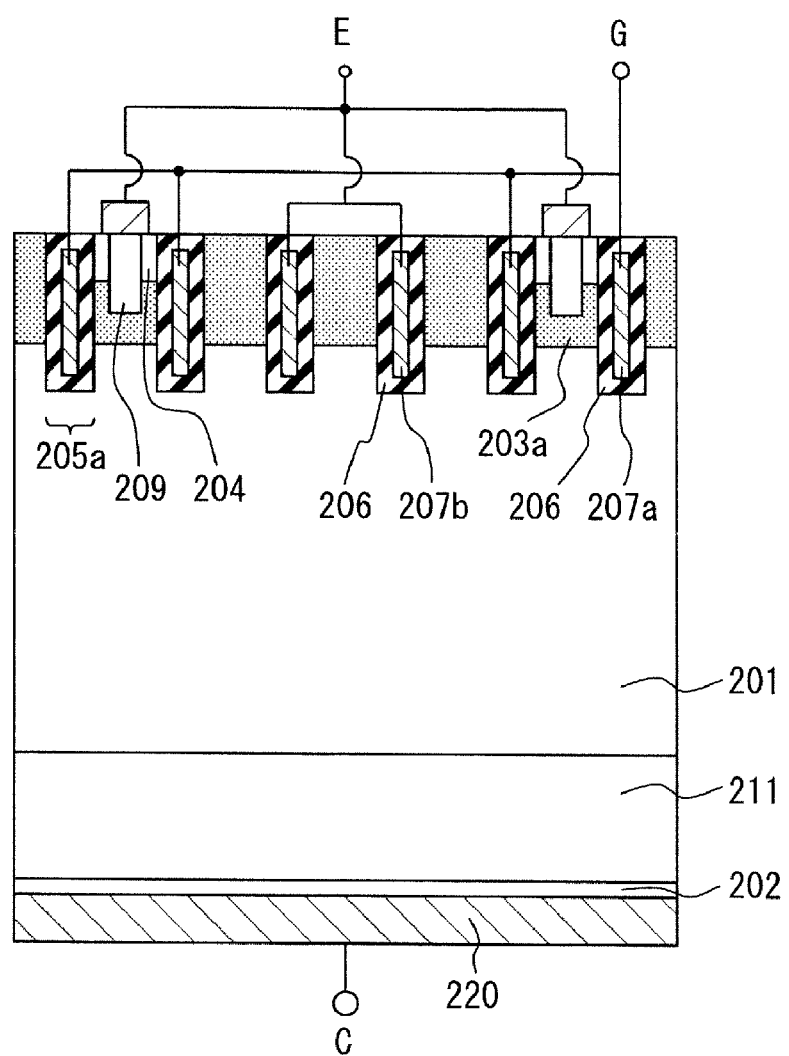
FIG. 34 is a cross sectional view showing another IGBT according to the related art.

A third advantage of the IGBTs is such that both the static breakdown voltage and the dynamic breakdown voltage are improved. FIGS. 24A and 24B show negative resistance characteristics for defining the static breakdown voltage, and FIG. 25 shows turn-off characteristics for defining the dynamic breakdown voltage in the IGBTs shown in FIGS. 20-22, a trench type IGBT as a comparison (not shown) having an embedded electrode only connecting to the second channel segment region 203b-2 according to a related art, the trench type IGBTs shown in FIGS. 30 and 34. Here, XXIVA and XXVA correspond to the device in FIGS. 20-21, XXIVB and XXVB correspond to the device in FIG. 22, XXIVC corresponds to the device having the embedded electrode only connecting to the second channel segment region 203b-2, XXIVD corresponds to the device in FIG. 30, and XXIVE and XXVC corresponds to the device in FIG. 34. In FIG. 24B, $V_{CE}$max represents a maximum breakdown voltage measured, and $\Delta V_{CE}$ represents a breakdown voltage reduction by negative resistance characteristics. The measured maximum breakdown voltage $V_{CE}$max in XXIVE is 1264 volts, which is the largest voltage. The device shown in FIGS. 20-21 has the measured maximum breakdown voltage $V_{CE}$max in XXIVA of 1232 volts, and the device shown in FIG. 22 has the measured maximum breakdown voltage $V_{CE}$max in XXIVB of 1222 volts, which is substantially equal to that of the device in FIGS. 20-21 and is the middle voltage. The measured maximum breakdown voltage $V_{CE}$max in XXIVC is 1080 volts, and the measured maximum breakdown voltage $V_{CE}$max in XXIVD is 1091 volts, which is substantially equal to that in XXIVC and the smallest voltage. The breakdown voltage reduction $\Delta V_{CE}$ by negative resistance characteristics in XXIVA of the device in FIGS. 20-21 is 200 volts. The breakdown voltage reduction $\Delta V_{CE}$ in XXIVB of the device in FIG. 22 is 196 volts. The breakdown voltage reduction $\Delta V_{CE}$ in XXIVE of the device in FIG. 34 is 225 volts. However, the breakdown voltage reduction $\Delta V_{CE}$ in XXIVC is equal to or larger than 570 volts, and the breakdown voltage reduction $\Delta V_{CE}$ in XXIVD of the device in FIG. 30 is equal to or larger than 223 volts, which are comparatively large.

FIG. 25 shows turn-off characteristics for defining the dynamic breakdown voltage. The characteristics are measured under a condition that a bus voltage Vbus is 650 volts, a collector current Ic is 400 amperes, an inductance of a measurement circuit Ls is 120 nH, a gate resistance Rg (off) is 15 ohm, and a connection temperature is 425K. XXVA corresponds to the device shown in FIGS. 20-21, XXVB corresponds to the device shown in FIG. 22, and XXVC corresponds to the device shown in FIG. 24. In the device shown in FIG. 24, the embedded electrode is only connected to the second channel segment region 203b-2, which does not contact the first trench. XXVC in FIG. 25 shows that the device in FIG. 24 cannot turn off. This is because the dynamic breakdown voltage is reduced to about 350 volts. XXVA and XXVB show that the devices in FIGS. 20-22 properly turn off.

A fourth advantage of the IGBTs is such that both the high-speed switching and the soft switching are obtained. FIGS. 26A and 27A show reverse recovery characteristics of a free wheel diode reversely connected in parallel to the trench type IGBT shown in FIG. 14. The device shown in FIG. 14 having high breakdown voltage has the embedded electrode and the emitter electrode, which are connected to each other so that they have the same electric potential. FIGS. 26B and 27B show reverse recovery characteristics of a free wheel diode reversely connected in parallel to the trench type IGBT shown in FIGS. 20-21. FIGS. 26A and 26B show that a reverse breakdown voltage is recovered from a small current of 30 amperes, and FIGS. 27A and 27B show that a reverse breakdown voltage is recovered from a large current of 400 amperes. In FIGS. 26A to 27B, a vertical axis represents an anode current on the right side of the drawing, and a voltage between the anode and the cathode on the left side of the drawing. In FIGS. 26A and 27B, the forward current Ic is 30 amperes, a current density is 60 A/cm$^2$, and a DC bus voltage is 650 volts before the reverse recovery. The IGBTs in FIGS. 26A to 27B are field stop type IGBTs, and the gate resistance in the on-state is 5 ohms, and the floating inductance Ls of a main circuit is 60 nH.

Regarding the switching speed, a turn-off time of the IGBT shown in FIGS. 20-21 is shown as XXVIB in FIG. 26B and XXVIIB in FIG. 27B, which is about 500 nano seconds. A turn-off time of the IGBT shown in FIG. 34 is shown as XXVIA in FIG. 26A and XXVIIA in FIG. 27A, which is about 500 nano seconds. Thus, the turn-off time of the device shown in FIGS. 20-21 is almost the same as the device shown in FIG. 34. However, a hopping voltage in case of turn-off in the device shown in FIG. 34 is shown as an arrow in FIGS. 26A and 27A, and a hopping voltage in case of turn-off in the device shown in FIGS. 20-21 is shown as an arrow in FIG. 26B and FIG. 27B. The hopping voltage in FIG. 26A is larger than the hopping voltage in FIG. 26B in a case where the small current recovery of 30 amperes, so that the device in FIG. 26A shows a hard waveform. The hopping voltage in FIG. 27A is larger than the hopping voltage in FIG. 27B in a case where the large current recovery of 400 amperes, so that the device in FIG. 27A shows a hard waveform. Thus, the switching waveform of the device shown in FIGS. 20-21 is softened, compared with the device shown in FIG. 34. Here, if the hopping voltage in case of turn-off is large, a motor surge such as discharge between lines under operation of an inverter is generated when a power semiconductor device is used for the inverter.

In FIGS. 24A and 24B, the breakdown voltage of the device shown in FIGS. 20-21 is slightly different from that of the device shown in FIG. 22. Specifically, the breakdown voltage of the device in FIGS. 20-21 is 1232 volts, which is slightly larger than that of the device in FIG. 22. Regarding the turn-on characteristics, FIG. 28 shows a turn-on waveform in different devices. XXVIIIA represents the device shown in FIGS. 20-21, XXVIIIB represents the device shown in FIG. 22, and XXVIIIC represents the device shown in FIG. 34. The turn-on waveform in the device in FIGS. 20-21 is substantially the same as the device shown in FIG. 22. Thus, the turn-on characteristics of the device in FIGS. 20-21 are substantially the same as the device in FIG. 22. Here, in FIG. 28, a vertical axis represents a collector current Ic having a scale of 20V/div. and a voltage $V_{CE}$ between the collector and the emitter. In FIG. 28, the on-state current Ic is 30 amperes, and the DC bus voltage is 350 volts. The IGBT is a field stop type IGBT. The gate resistan2ce in the on-state is 15 ohm. The floating inductance Ls of a main circuit is 120 nH. Since the turn-on waveform in the device in FIGS. 20-21 is substantially the same as the device shown in FIG. 22, the second channel segment region 203b-2 contacting the second trench 205b, in which the embedded electrode 207b is embedded via the insulation film 206, does not affect the switching characteristics.

Thus, in the trench gate type IGBT or IEGT, the second trench 205b is formed in the second channel region as a floating P type layer 203b, the embedded electrode 207b is formed in the second trench 205b via the insulation film 206. The embedded electrode 207b is electrically connected to at least the second channel segment region 203b-1 adjacent to the first trench 205a, in which the gate electrode 207 is formed. These features enable to obtain the low on-state voltage almost equal to the IEGT, the low switching loss, the high breakdown voltage and the soft switching characteristics.

The above disclosure has the following aspects.

According to a first aspect of the present disclosure, a semiconductor device having an insulated gate semiconductor element includes: a semiconductor substrate having a first conductive type; a drift layer having a second conductive type and disposed on the substrate; a base layer having the first conductive type and disposed on the drift layer; a plurality of trenches penetrating the base layer and reaching the drift layer, wherein the base layer is divided into a plurality of base parts by the plurality of trenches, and each trench extends along with a first direction; an emitter region having the second conductive type, disposed in one of the base parts, and contacting a sidewall of a corresponding trench; a gate element disposed in each trench via an insulation film; an emitter electrode electrically coupled with the emitter region; and a collector electrode disposed on a backside of the substrate, wherein the collector electrode is opposite to the drift layer. Each base part extends in the first direction so that the plurality of the base parts are in parallel to each other. The one of the base parts provides a channel layer, in which the emitter region is disposed, and another one of the base parts provides a float layer, in which no emitter region is disposed. The channel layer and the float layer are repeatedly arranged in a predetermined order in such a manner that a ratio between the number of the channel layer and the number of the float layer is constant. The gate element includes a gate electrode and a dummy gate electrode. The gate electrode is disposed in the corresponding trench contacting the channel layer, and the dummy gate electrode is disposed in another trench contacting the float layer. The float layer includes a first float layer adjacent to the channel layer via the gate electrode and a second float layer apart from the channel layer via the dummy gate electrode. The dummy gate electrode and the first float layer are electrically coupled with a first float wiring, which extends in a second direction perpendicular to the first direction and is disposed on the base layer. The dummy gate electrode is electrically isolated from the second float layer.

Since the dummy gate electrode is electrically connected to the first float layer, a switching surge voltage and a switching loss are balanced. Further, since the float layers are connected to different wirings, operation of the device is performed homogeneously, and thereby, a break down voltage of the device is improved.

Alternatively, the second float layer may be electrically coupled with a second float wiring, which extends in the second direction and is disposed on the base layer, and the dummy gate electrode is electrically isolated from the second float wiring.

According to a second aspect of the present disclosure, a semiconductor device having an insulated gate semiconductor element includes: a semiconductor substrate having a first conductive type; a drift layer having a second conductive type and disposed on the substrate; a base layer having the first conductive type and disposed on the drift layer; a plurality of trenches penetrating the base layer and reaching the drift layer, wherein the base layer is divided into a plurality of base parts by the plurality of trenches, and each trench extends along with a first direction; an emitter region having the second conductive type, disposed in one of the base parts, and contacting a sidewall of a corresponding trench; a gate element disposed in each trench via an insulation film; an emitter electrode electrically coupled with the emitter region; and a collector electrode disposed on a backside of the substrate, wherein the collector electrode is opposite to the drift layer. Each base part extends in the first direction so that the plurality of the base parts are in parallel to each other. The one of the base parts provides a channel layer, in which the emitter region is disposed, and another one of the base parts provides a float layer, in which no emitter region is disposed. The channel layer and the float layer are repeatedly arranged in a predetermined order in such a manner that a ratio between the number of the channel layer and the number of the float layer is constant. The gate element includes a gate electrode and a dummy gate electrode. The gate electrode is disposed in the corresponding trench contacting the channel layer, and the dummy gate electrode is disposed in another trench contacting the float layer. The float layer includes a first float layer adjacent to the channel layer via the gate electrode. The dummy gate electrode includes a first dummy gate electrode adjacent to the first float layer via the insulation film. The first dummy gate electrode and the first float layer are electrically coupled with a first float wiring, which extends in a second direction perpendicular to the first direction and is disposed on the base layer.

In the above device, a switching surge voltage and a switching loss are balanced. Further, operation of the device is performed homogeneously, and thereby, a break down voltage of the device is improved.

Alternatively, the float layer may further include a second float layer apart from the channel layer via the dummy gate electrode. The dummy gate electrode further includes a second dummy gate electrode apart from the first float layer via the second float layer, and the second dummy gate electrode and the second float layer are electrically coupled with a second float wiring, which extends in the second direction and is disposed on the base layer.

Alternatively, the plurality of trenches may have a ring planar shape in such a manner that adjacent two trenches provide a pair and a ring so that the ring planar shape provides a multiple ring structure.

Alternatively, the gate electrode may be electrically coupled with a gate wiring, which extends in the second direction and is disposed on the base layer. The gate wiring and the first and second float wirings are disposed on one end of the gate element in the first direction, and the gate wiring and the first and second float wirings are in parallel to each other.

Alternatively, the emitter electrode may be divided into two emitter parts at a center of the gate element in the first direction. The gate electrode is electrically coupled with a gate wiring, which extends in the second direction and is disposed on the base layer. The gate wiring and the first and second float wirings are disposed between the two emitter parts. The gate wiring and the first and second float wirings are in parallel to each other. In this case, even if a chip size is large, imbalance caused by transmitting delay of an electric potential in the dummy gate electrode is reduced. Thus, a switching surge voltage and a switching loss are balanced. Further, operation of the device is performed homogeneously, and thereby, a break down voltage of the device is improved.

According to a third aspect of the present disclosure, a trench gate type insulated gate bipolar transistor includes: a semiconductor substrate having a first conductive type; a channel region having a second conductive type and disposed on a first side of the substrate, wherein the channel region includes a first channel region and a second channel region; an emitter region having the first conductive type and disposed in a surface portion of the first channel region; a plurality of trenches penetrating the channel region and reaching the substrate, wherein the plurality of trenches includes a first trench and a second trench, wherein the first channel region only contacts the first trench, and the second channel region contacts the second trench; a gate electrode disposed in the first trench via an insulation film; an embedded electrode disposed in the second trench via the insulation film, wherein the embedded electrode is electrically separated from the gate electrode; and an emitter electrode electrically coupling both the emitter region and the first channel region, wherein the emitter electrode covers the gate electrode, the embedded electrode and the second channel region via the insulation film so that the emitter electrode is electrically separated from the gate electrode, the embedded electrode and the second channel region. The embedded electrode electrically couples at least the second channel region, which is sandwiched between the first trench and the second trench.

In the above transistor, the on-state voltage is low, which is almost equal to that of an IEGT. Further, the transistor has a low switching loss, a high breakdown voltage and soft switching characteristics.

Alternatively, the embedded electrode may electrically couple only the second channel region, which is sandwiched between the first trench and the second trench. Alternatively, the embedded electrode may have a part of a surface, which is electrically coupled with a part of a surface of the second channel region. Alternatively, the channel region may further include one or more first channel regions. The embedded electrode and the second channel region between adjacent two first channel regions are electrically coupled with each other so that the embedded electrode is not connected to the second channel region over the first channel region.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A trench gate type insulated gate bipolar transistor comprising:
   a semiconductor substrate having a first conductive type;
   a channel region having a second conductive type and disposed on a first side of the substrate, wherein the channel region includes a first channel region and a second channel region;
   an emitter region having the first conductive type and disposed in a surface portion of the first channel region;
   a plurality of trenches penetrating the channel region and reaching the substrate, wherein the plurality of trenches includes a first trench and a second trench, wherein the first channel region only contacts the first trench, and the second channel region contacts the second trench;
   a gate electrode disposed in the first trench via an insulation film;
   an embedded electrode disposed in the second trench via the insulation film, wherein the embedded electrode is electrically separated from the gate electrode; and
   an emitter electrode electrically coupling both the emitter region and the first channel region, wherein the emitter electrode covers the gate electrode, the embedded electrode and the second channel region via the insulation film so that the emitter electrode is electrically separated from the gate electrode, the embedded electrode and the second channel region,
   wherein the embedded electrode electrically couples at least the second channel region, which is sandwiched between the first trench and the second trench.

2. The trench gate insulated gate bipolar transistor according to claim 1,
   wherein the embedded electrode electrically couples only the second channel region, which is sandwiched between the first trench and the second trench.

3. The trench gate type insulated gate bipolar transistor according to claim 1,
   wherein the embedded electrode has a part of a surface, which is electrically coupled with a part of a surface of the second channel region.

4. The trench gate type insulated gate bipolar transistor according to claim 1,
   wherein the channel region further includes one or more first channel regions, and
   wherein the embedded electrode and the second channel region between adjacent two first channel regions are electrically coupled with each other so that the embedded electrode is not connected to the second channel region over the first channel region.

* * * * *